US008866218B2

(12) United States Patent  
Kinzer et al.

(10) Patent No.: US 8,866,218 B2  
(45) Date of Patent: Oct. 21, 2014

(54) WAFER LEVEL MOSFET METALLIZATION

(71) Applicant: Fairchild Semiconductor Corporation, South Portland, ME (US)

(72) Inventors: Daniel M. Kinzer, El Segundo, CA (US); Steven Sapp, Felton, CA (US); Chung-Lin Wu, San Jose, CA (US); Oseob Jeon, Seoul (KR); Bigidis Dosdos, San Jose, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 13/918,562

(22) Filed: Jun. 14, 2013

(65) Prior Publication Data

US 2013/0277735 A1     Oct. 24, 2013

Related U.S. Application Data

(63) Continuation of application No. 13/074,921, filed on Mar. 29, 2011, now Pat. No. 8,487,371.

(51) Int. Cl.
| | |
|---|---|
| *H01L 29/66* | (2006.01) |
| *H01L 23/62* | (2006.01) |
| *H01L 23/02* | (2006.01) |
| *H01L 29/78* | (2006.01) |
| *H01L 29/417* | (2006.01) |
| *H01L 23/00* | (2006.01) |

(52) U.S. Cl.
CPC ... *H01L 29/7827* (2013.01); *H01L 2924/01033* (2013.01); *H01L 2224/131* (2013.01); *H01L 29/66666* (2013.01); *H01L 2924/01029* (2013.01); *H01L 24/13* (2013.01); *H01L 2924/014* (2013.01); *H01L 2924/13091* (2013.01); *H01L 29/7813* (2013.01); *H01L 2924/01013* (2013.01); *H01L 2924/09701* (2013.01); *H01L 29/41766* (2013.01); *H01L 2924/13055* (2013.01); *H01L 29/7809* (2013.01); *H01L 2924/01079* (2013.01); *H01L 2924/01047* (2013.01)
USPC ............ 257/330; 257/357; 257/401; 257/678

(58) Field of Classification Search
CPC ..................... H01L 29/7827; H01L 29/66666; H01L 2224/131; H01L 24/13; H01L 29/41766; H01L 29/7809; H01L 29/7813; H01L 2924/01013; H01L 2924/01029
USPC ........... 257/330, 678, 357, 401, 774; 438/127
See application file for complete search history.

(56) References Cited

U.S. PATENT DOCUMENTS

| | | |
|---|---|---|
| 3,564,356 A | 2/1971 | Wilson |
| 4,003,072 A | 1/1977 | Matsushita et al. |
| 4,636,281 A | 1/1987 | Buiguez et al. |

(Continued)

FOREIGN PATENT DOCUMENTS

| | | |
|---|---|---|
| JP | 2001-244461 A | 9/2001 |
| JP | 2003-303960 A | 10/2003 |

(Continued)

*Primary Examiner* — Long K Tran  
*Assistant Examiner* — Dzung Tran

(57) ABSTRACT

In one general aspect, a system can include a through-silicon-via (TSV) coupling a drain region associated with a vertical transistor to a back metal disposed on a second side of the substrate opposite the first side. The system can include a first metal layer, and a second metal layer aligned orthogonal to the first metal layer. The system can define a conduction path extending substantially vertically through the TSV to the substrate and laterally through the substrate.

21 Claims, 11 Drawing Sheets

(56) References Cited

U.S. PATENT DOCUMENTS

| | | |
|---|---|---|
| 4,824,793 A | 4/1989 | Richardson et al. |
| 5,023,196 A | 6/1991 | Johnsen et al. |
| 5,065,273 A | 11/1991 | Rajeevakumar |
| 5,071,782 A | 12/1991 | Mori |
| 5,134,448 A | 7/1992 | Johnsen et al. |
| 5,156,989 A | 10/1992 | Williams et al. |
| 5,208,657 A | 5/1993 | Chatterjee et al. |
| 5,233,215 A | 8/1993 | Baliga |
| 5,430,324 A | 7/1995 | Bencuya |
| 5,436,189 A | 7/1995 | Beasom |
| 5,572,048 A | 11/1996 | Sugawara |
| 5,589,405 A | 12/1996 | Contiero et al. |
| 5,605,852 A | 2/1997 | Bencuya |
| 5,639,676 A | 6/1997 | Hshieh et al. |
| 5,710,072 A | 1/1998 | Krautschneider et al. |
| 5,719,409 A | 2/1998 | Singh et al. |
| 5,900,663 A | 5/1999 | Johnson et al. |
| 5,943,581 A | 8/1999 | Lu et al. |
| 5,945,708 A | 8/1999 | Tihanyi |
| 5,949,104 A | 9/1999 | D'Anna et al. |
| 5,959,324 A | 9/1999 | Kohyama |
| 5,960,311 A | 9/1999 | Singh et al. |
| 5,973,360 A | 10/1999 | Tihanyi |
| 5,981,344 A | 11/1999 | Hshieh et al. |
| 6,020,250 A | 2/2000 | Kenney |
| 6,034,415 A | 3/2000 | Johnson et al. |
| 6,037,202 A | 3/2000 | Witek |
| 6,037,633 A | 3/2000 | Shinohara |
| 6,040,600 A | 3/2000 | Uenishi et al. |
| 6,048,772 A | 4/2000 | D'Anna |
| 6,072,215 A | 6/2000 | Kawaji et al. |
| 6,103,578 A | 8/2000 | Uenishi et al. |
| 6,103,619 A | 8/2000 | Lai |
| 6,159,841 A | 12/2000 | Williams et al. |
| 6,163,052 A | 12/2000 | Liu et al. |
| 6,184,545 B1 | 2/2001 | Werner et al. |
| 6,184,555 B1 | 2/2001 | Tihanyi et al. |
| 6,222,233 B1 | 4/2001 | D'Anna |
| 6,229,194 B1 | 5/2001 | Lizotte |
| 6,271,552 B1 | 8/2001 | D'Anna |
| 6,307,246 B1 | 10/2001 | Nitta et al. |
| 6,337,499 B1 | 1/2002 | Werner |
| 6,346,464 B1 | 2/2002 | Takeda et al. |
| 6,362,505 B1 | 3/2002 | Tihanyi |
| 6,392,290 B1 | 5/2002 | Kasem et al. |
| 6,445,019 B2 | 9/2002 | Van Dalen |
| 6,472,678 B1 | 10/2002 | Hshieh et al. |
| 6,495,421 B2 | 12/2002 | Luo |
| 6,541,817 B1 | 4/2003 | Hurkx et al. |
| 6,545,316 B1 | 4/2003 | Baliga |
| 6,566,804 B1 | 5/2003 | Trujillo et al. |
| 6,586,801 B2 | 7/2003 | Onishi et al. |
| 6,608,350 B2 | 8/2003 | Kinzer et al. |
| 6,653,740 B2 | 11/2003 | Kinzer et al. |
| 6,909,141 B2 | 6/2005 | Rosner et al. |
| 7,352,036 B2 | 4/2008 | Grebs et al. |
| 7,566,931 B2 | 7/2009 | Kocon |
| 7,759,198 B2 | 7/2010 | Seo et al. |
| 7,768,075 B2 | 8/2010 | Yilmaz et al. |
| 7,781,894 B2 | 8/2010 | Oikawa |
| 2003/0062622 A1 | 4/2003 | Pavier et al. |
| 2003/0213997 A1 | 11/2003 | Parker et al. |
| 2004/0108554 A1 | 6/2004 | Hshieh et al. |
| 2009/0278167 A1 | 11/2009 | Ozoe |
| 2012/0153384 A1 | 6/2012 | Grebs et al. |
| 2012/0248526 A1 | 10/2012 | Kinzer et al. |

FOREIGN PATENT DOCUMENTS

| | | |
|---|---|---|
| WO | 00-68997 A1 | 11/2000 |
| WO | 00-68998 A1 | 11/2000 |
| WO | 01-06550 A1 | 1/2001 |

WAFER LEVEL MOSFET METALLIZATION

CROSS-REFERENCE TO RELATED APPLICATION

This application is a continuation application of U.S. application Ser. No. 13/074,921, filed Mar. 29, 2011, which is incorporated herein by reference in its entirety. The application is related to commonly assigned U.S. patent application Ser. No. 11/400,729 titled "Semiconductor Die Packages Using Thin Dies and Metal Substrates," by Yilmaz et al. (now U.S. Pat. No. 7,768,075), which is incorporated by reference in its entirety herein for all purposes.

BACKGROUND

The present invention relates to semiconductor power device technology and more particularly to improved trench vertical MOSFET devices and fabrication processes for forming such devices.

Semiconductor packages are well known in the art. These packages can sometimes include one or more semiconductor devices, such as an integrated circuit (IC) device, die or chip. The IC devices can include electronic circuits that have been manufactured on a substrate made of semiconductor material. The circuits are made using many known semiconductor processing techniques such as deposition, etching, photolithography, annealing, doping and diffusion. Silicon wafers are typically used as the substrate on which these IC devices are formed.

An example of a semiconductor device is a metal oxide semiconductor field effect transistor (MOSFET) device, which is used in numerous electronic apparatuses including power supplies, automotive electronics, computers and battery powered devices like mobile phones. MOSFET devices can be used in a variety of applications such as switches that connect power supplies to particular electronic devices having a load. MOSFET devices can be formed in a trench that has been etched into a substrate or onto an epitaxial layer that has been deposited onto a substrate.

MOSFET devices operate by applying an appropriate voltage to a gate electrode of a MOSFET device which turns the device ON and forms a channel connecting a source and a drain of the MOSFET allowing a current to flow. Once the MOSFET device is turned on, the relationship between the current and the voltage is nearly linear which means that the device behaves like a resistor. In transistors, including MOSFET devices, it is desirable to have low drain-to-source resistance $R_{DS}(on)$ while the transistor is on.

Vertical MOSFET devices typically try to achieve low $R_{DS}(on)$ by placing the drain on a surface which is opposite the surface of the source contact. By placing the drain on the surface opposite the source contact, the conduction path for current is reduced, which causes the $R_{DS}(on)$ to be reduced. However, placing the drain and drain contact on a surface which is opposite (and different) to the surface that the source contact is placed, makes it difficult to package the transistor, especially for Wafer Level Chip Scale Packaging (WLCSP), because electrical connections must be supplied to both sides of the package. When using WLCSP to package transistors it is necessary to place all the contacts including the source contact, drain contact and gate contact on the same side of the package. This type of configuration allows easy connection to circuit board traces using solder balls on the one surface of the WLCSP that are connected to each of the transistor terminals.

Since the $R_{DS}(on)$ of vertical transistors are optimized when the drain contacts and the source contacts are placed on opposite surfaces and WLCSP is optimized when all the contacts are on the same surface, it is not desirable to use WLCSP to package vertical transistors. Therefore, what is needed is a system and method that allows for using a vertical transistor with all the contacts on one side while still maintaining excellent electrical properties with low $R_{DS}(on)$.

BRIEF SUMMARY

Embodiments of the present invention provide techniques for fabricating WLCSP devices with transistors having source, drain and gate contacts on one side of the transistor while still having excellent electrical performance with very low drain-to-source resistance $R_{DS}(on)$.

In one embodiment, a WLCSP includes a vertical transistor that has a source contact, a drain contact, a first metal layer and a second metal layer. The source contact and the drain contact are disposed on the same side of the vertical transistor. The first metal layer includes a first metal source layer coupled (electrically connected) to a source region of the vertical transistor, and a first metal drain layer coupled (electrically connected) to a drain region of the vertical transistor. The first metal source layer and the first metal drain layer are electrically insulated from each other. The second metal layer includes a second metal source layer, which is coupled (electrically connected) to the source contact and the first metal source layer, and a second metal drain layer, which is coupled (electrically connected) to the drain contact and the first metal drain layer. The second metal source layer and the second metal drain layer are electrically insulated from each other. The first metal source layer, the first metal drain layer, the second metal source layer, and the second metal drain layer are interleaved and form a reduced conduction path length between the source contact and the drain contact. The WLCSP further includes a gate structure disposed in a trench adjacent the source region, a well region disposed adjacent the trench and the source region, a drift region disposed adjacent and under the well region and directly on a substrate, and a conduction path. The conduction path extends vertically from the drain contact to the substrate, laterally through the substrate, and vertically from the substrate through the drift region to the source contact.

In this embodiment, the drain-to-source resistance $R_{DS}(on)$ between the source contact and the drain contact can be less than 11.5 m$\Omega$-mm$^2$ when the system is turned ON. The vertical transistor can be a vertical MOSFET. The first metal layer can further include a first metal gate layer coupled (electrically connected) to a gate region of the vertical transistor, wherein the first metal gate layer is electrically insulated from the first metal source layer and the first metal drain layer. The second metal layer can also further include a second metal gate layer coupled (electrically connected) to a gate contact and the first metal gate layer, wherein the second metal gate layer is electrically insulated from the second metal source layer and the second metal drain layer.

In yet another embodiment, a WLCSP, which uses through substrate vias to improve $R_{DS}(on)$, includes a vertical transistor that has a source contact, a drain contact, a through-silicon-via (TSV), a first metal layer and a second metal layer. The source contact and the drain contact are disposed on the same side of the vertical transistor. The TSV couples (electrically connects) a drain region of the vertical transistor to a back metal disposed on the side of the substrate opposite the source and drain contacts. The first metal layer includes a first metal source layer coupled (electrically connected) to a source region of the vertical transistor, and a first metal drain layer coupled (electrically connected) to a drain region of the vertical transistor. The first metal source layer and the first metal drain layer are electrically insulated from each other. The second metal layer includes a second metal source layer, which is coupled (electrically connected) to the source contact and the first metal source layer, and a second metal drain layer, which is coupled (electrically connected) to the drain contact and the first metal drain layer. The second metal source layer and the second metal drain layer are electrically insulated from each other. The first metal source layer, the first metal drain layer, the second metal source layer, and the second metal drain layer are interleaved and form a reduced conduction path length between the source contact and the drain contact. The WLCSP further includes a gate structure disposed in a trench adjacent the source region, a well region disposed adjacent the trench and the source region, a drift region disposed adjacent and under the well region and directly on a substrate, and a conduction path. The conduction path extends vertically from the drain contact through the TSV to the substrate, laterally through the substrate, vertically from the substrate through the PSV (Partial-substrate-via) to the drift region, and vertically from the PSV to the source contact. The PSV is formed partially through the substrate and can be connected to the back metal.

In yet another embodiment, a WLCSP, which uses through substrate vias to improve $R_{DS}$(on), includes a vertical transistor that has a source contact, a drain contact, a through-silicon-via (TSV), a first metal layer and a second metal layer. The source contact and the drain contact are disposed on the same side of the vertical transistor. The TSV couples (electrically connects) a drain region of the vertical transistor to a back metal disposed on the side of the substrate opposite the source and drain contacts. The first metal layer includes a first metal source layer coupled (electrically connected) to a source region of the vertical transistor, and a first metal drain layer coupled (electrically connected) to a drain region of the vertical transistor. The first metal source layer and the first metal drain layer are electrically insulated from each other. The second metal layer includes a second metal source layer, which is coupled (electrically connected) to the source contact and the first metal source layer, and a second metal drain layer, which is coupled (electrically connected) to the drain contact and the first metal drain layer. The second metal source layer and the second metal drain layer are electrically insulated from each other. The first metal source layer, the first metal drain layer, the second metal source layer, and the second metal drain layer are interleaved and form a reduced conduction path length between the source contact and the drain contact. The WLCSP further includes a gate structure disposed in a trench adjacent the source region, a well region disposed adjacent the trench and the source region, a drift region disposed adjacent and under the well region and directly on a substrate, and a conduction path. The conduction path extends vertically from the drain contact through the TSV to the back metal, laterally through the back metal, and vertically from the back metal to the source contact In this embodiment, the drain-to-source resistance $R_{DS}$(on) between the source contact and the drain contact can be less than 7.9 m$\Omega$-mm$^2$ when the system is turned ON. The vertical transistor can be a vertical MOSFET. The first metal layer can further include a first metal gate layer coupled (electrically connected) to a gate region of the vertical transistor, wherein the first metal gate layer is electrically insulated from the first metal source layer and the first metal drain layer. The second metal layer can further include a second metal gate layer coupled (electrically connected) to agate contact and the first metal gate layer, wherein the second metal gate layer is electrically insulated from the second metal source layer and the second metal drain layer.

In yet another embodiment, a WLCSP, which uses a metal, such as copper for example, that is closely connected to the drain drift region to improve $R_{DS}$(on), includes a vertical transistor that has a source contact and a drain contact, a first metal layer, a second metal layer, and a third metal layer. The source contact and the drain contact are disposed on the same side of the vertical transistor. The first metal layer includes a first metal source layer coupled (electrically connected) to a source region of the vertical transistor, and a first metal drain layer coupled (electrically connected) to a drain region of the vertical transistor. The first metal source layer and the first metal drain layer are electrically insulated from each other. The second metal layer includes a second metal source layer, which is coupled (electrically connected) to the source contact and the first metal source layer, and a second metal drain layer, which is coupled (electrically connected) to the drain contact and the first metal drain layer. The second metal source layer and the second metal drain layer are electrically insulated from each other. The first metal source layer, the first metal drain layer, the second metal source layer, and the second metal drain layer are interleaved and form a reduced conduction path length between the source contact and the drain contact. The WLCSP further includes a gate structure disposed in a trench adjacent the source region, a well region disposed adjacent the trench and the source region, a drift region disposed adjacent and under the well region and directly on a third metal layer. The third metal is disposed under the source region of the vertical transistor and the drain region of the vertical transistor. The third metal layer is disposed between a carrier and a vertical transistor on the side opposite the source contact and the drain contact. The conduction path extends vertically from the drain contact to the third metal, laterally through the third metal, and vertically from the third metal through the drift region to the source contact.

In this embodiment, the drain-to-source resistance $R_{DS}$(on) between the source contact and the drain contact can be less than 7 m$\Omega$-mm$^2$ when the system is turned ON. The vertical transistor can be a vertical MOSFET. The first metal layer can further include a first metal gate layer coupled (electrically connected) to a gate region of the vertical transistor, wherein the first metal gate layer is electrically insulated from the first metal source layer and the first metal drain layer. The second metal layer can further include a second metal gate layer coupled (electrically connected) to a gate contact and the first metal gate layer, wherein the second metal gate layer is electrically insulated from the second metal source layer and the second metal drain layer.

In yet another embodiment, the third metal layer is closely connected to the drain drift region.

In yet another embodiment, the third metal layer can be copper, aluminum, silver, gold other metals or other metals or alloys that exhibit low resistance. The metal layer is closely connected to the drain drift region.

In yet another embodiment, a method of forming a WLCSP includes forming a vertical transistor including a source region and a drain region, forming a first metal layer, and forming a second metal layer. The first metal layer includes a first metal source layer coupled (electrically connected) to a source region of the vertical transistor and a first metal drain layer coupled (electrically connected) to a drain region of the vertical transistor. The first metal source layer and the first metal drain layer are electrically insulated from each other. The second metal layer includes a second metal source layer, which is coupled (electrically connected) to the first metal source layer, and a second metal drain layer, which is coupled (electrically connected) to the first metal drain layer. The second metal source layer and the second metal drain layer are electrically insulated from each other. The first metal source layer, the first metal drain layer, the second metal source layer, and the second metal drain layer are interleaved. The method further includes forming a source contact and a drain contact on the same side of the vertical transistor. The source contact is coupled (electrically connected) to the second metal source layer and the drain contact is coupled (electrically connected) to the second metal drain layer. The method further includes forming a gate structure, a well region, a drift region, and a conduction path. The drift region is disposed adjacent and under the well region and directly on a substrate. The conduction path extends vertically from the drain contact to the substrate, laterally through the substrate, and vertically from the substrate through the drift region to the source contact.

In this embodiment, the drain-to-source resistance $R_{DS}$(on) between the source contact and the drain contact can be less than 11.5 mΩ-mm$^2$ when the device is turned ON. The vertical transistor can be a vertical MOSFET. The first metal layer can further include forming a first metal gate layer coupled (electrically connected) to a gate region of the vertical transistor. The first metal gate layer can be electrically insulated from the first metal source layer and the first metal drain layer. Forming the second metal layer can further include forming a second metal gate layer coupled (electrically connected) to a gate contact and the first metal gate layer. The second metal gate layer can be electrically insulated from the second metal source layer and the second metal drain layer.

In yet another embodiment, the conduction path has a length formed between the source first metal and the drain first metal that is everywhere less than 250 μm.

In yet another embodiment, the method further includes forming a via layer over the first metal layer. The via layer forms a via pattern over the first metal source layer and the first metal drain layer.

In yet another embodiment, a method of forming a WLCSP, which uses through substrate vias to improve $R_{DS}$(on), includes forming a through-silicon-via (TSV) that couples (electrically connects) a drain region of the vertical transistor to a back metal of the vertical transistor. The back metal of the vertical transistor is disposed on the side of the vertical transistor opposite the source contact and drain contact. The method further includes forming a partial-substrate-via (PSV), forming first metal layer, and forming a second metal layer. The RSV is disposed under a source region of the vertical transistor and coupled (electrically connected) to the back metal. The first metal layer includes a first metal source layer coupled (electrically connected) to a source region of the vertical transistor and a first metal drain layer coupled (electrically connected) to a drain region of the vertical transistor. The first metal source layer and the first metal drain layer are electrically insulated from each other. The second metal layer includes a second metal source layer, which is coupled (electrically connected) to the first metal source layer, and a second metal drain layer, which is coupled (electrically connected) to the first metal drain layer. The second metal source layer and the second metal drain layer are electrically insulated from each other. The first metal source layer, the first metal drain layer, the second metal source layer, and the second metal drain layer are interleaved. The method further includes forming a source contact and a drain contact on the same side of the vertical transistor. The source contact is coupled (electrically connected) to the second metal source layer and the drain contact is coupled (electrically connected) to the second metal drain layer. The method also includes forming a gate structure, a well region, a drift region, and a conduction path. The drift region is disposed adjacent and under the well region and directly on a substrate. The conduction path extends vertically from the drain contact through the TSV to the substrate, laterally through the substrate and back-metal, vertically from the substrate and back-metal through the PSV to the drift region, and vertically from the RSV to the source contact.

In yet another embodiment, a method of forming a WLCSP, which uses through substrate vias to improve $R_{DS}$(on), includes forming a through-silicon-via (TSV) that couples (electrically connects) a drain region of the vertical transistor to a back metal of the vertical transistor. The back metal of the vertical transistor is disposed on the side of the vertical transistor opposite the source contact and drain contact. The method further includes forming a first metal layer, and forming a second metal layer. The first metal layer includes a first metal source layer coupled (electrically connected) to a source region of the vertical transistor and a first metal drain layer coupled (electrically connected) to a drain region of the vertical transistor. The first metal source layer and the first metal drain layer are electrically insulated from each other. The second metal layer includes a second metal source layer, which is coupled (electrically connected) to the first metal source layer, and a second metal drain layer, which is coupled (electrically connected) to the first metal drain layer. The second metal source layer and the second metal drain layer are electrically insulated from each other. The first metal source layer, the first metal drain layer, the second metal source layer, and the second metal drain layer are interleaved. The method further includes forming a source contact and a drain contact on the same side of the vertical transistor. The source contact is coupled (electrically connected) to the second metal source layer and the drain contact is coupled (electrically connected) to the second metal drain layer. The method also includes forming a gate structure, a well region, a drift region, and a conduction path. The drift region is disposed adjacent and under the well region and directly on a substrate. The conduction path extends vertically from the drain contact through the TSV to the back metal, laterally through the back metal, and vertically from the back metal to the source contact.

In this embodiment, the drain-to-source resistance $R_{DS}$(on) between the source contact and the drain contact can be less than 7.9 ml-mm$^2$ when the device is turned ON. The vertical transistor can be a vertical MOSFET. The conduction path can have a length formed between the source first metal and the drain first metal that is everywhere less than 250 μm.

In yet another embodiment, a method of forming a WLCSP, which uses a metal, such as copper, that is closely connected to the drain drift region to improve $R_{DS}$(on), includes forming a vertical transistor including a source region and a drain region, forming a first metal layer, and forming a second metal layer. The first metal layer includes a first metal source layer coupled (electrically connected) to a source region of the vertical transistor and a first metal drain layer coupled (electrically connected) to a drain region of the vertical transistor. The first metal source layer and the first metal drain layer are electrically insulated from each other. The second metal layer includes a second metal source layer, which is coupled (electrically connected) to the first metal source layer, and a second metal drain layer, which is coupled (electrically connected) to the first metal drain layer. The second metal source layer and the second metal drain layer are electrically insulated from each other. The first metal source layer, the first metal drain layer, the second metal source layer, and the second metal drain layer are interleaved. The method further includes forming a third metal layer disposed under the source region of the vertical transistor and the drain region of the vertical transistor. The third metal layer is disposed on a carrier and is connected to the vertical transistor on the side opposite the source region and the drain region. The method further includes forming a source contact and a drain contact on the same side of the vertical transistor, wherein the source contact is coupled (electrically connected) to the second metal source layer and the drain contact is coupled (electrically connected) to the second metal drain layer. The method also includes forming a gate structure, a well region, a drift region, and a conduction path. The drift region disposed adjacent and under the well region and over the third metal. The conduction path extends vertically from the drain contact to the third metal, laterally through the third metal, and vertically from the third metal through the drift region to the source contact.

In this embodiment, the drain-to-source resistance $R_{DS}$(on) between the source contact and the drain contact can be less than 7 mΩ-mm$^2$ when the device is turned ON. The vertical transistor can be a vertical MOSFET.

Further areas of applicability of the present disclosure will become apparent from the detailed description provided hereinafter. It should be understood that the detailed description and specific examples, white indicating various embodiments, are intended for purposes of illustration only and are not intended to necessarily limit the scope of the disclosure.

BRIEF DESCRIPTION OF THE DRAWINGS

A further understanding of the nature and advantages of the invention may be realized by reference to the remaining portions of the specification and the drawings, presented below. The Figures are incorporated into the detailed description portion of the invention. Like reference numerals refer to the same items throughout the Figures.

DETAILED DESCRIPTION

Figure 1A:
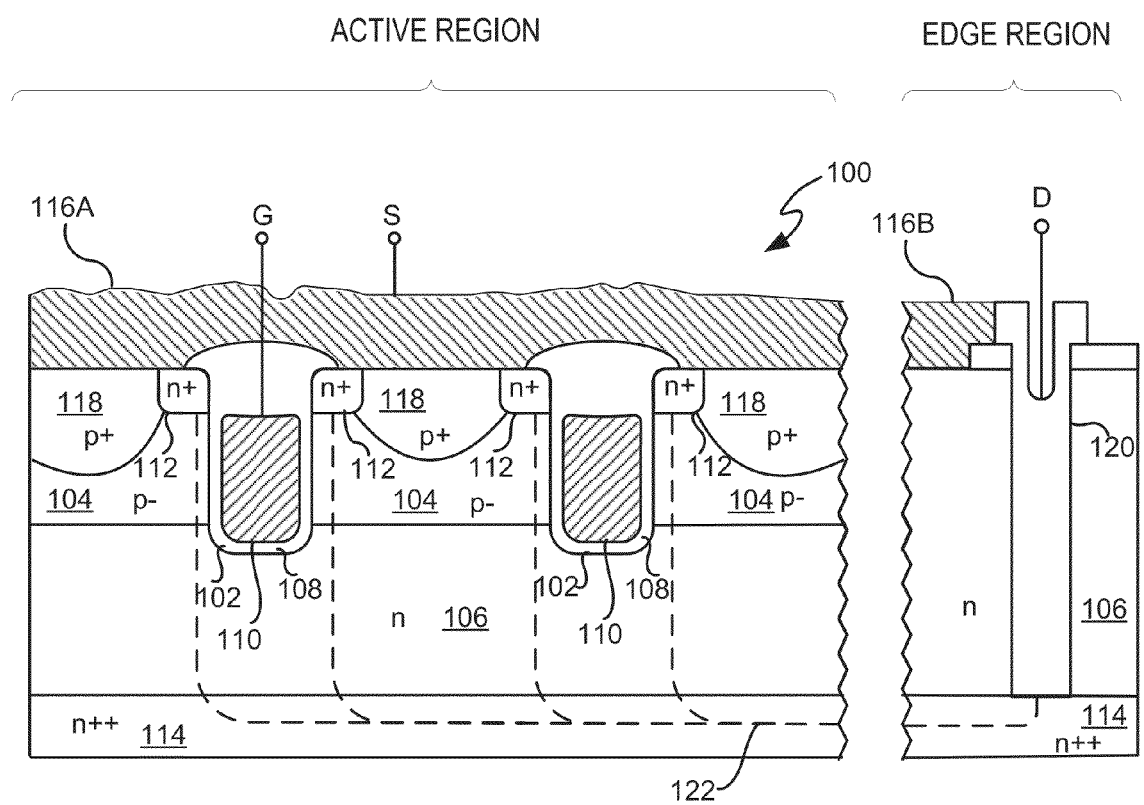
FIG. 1A shows cross-sectional view of a portion of an exemplary n-type tri-vertical MOSFET device with source and drain contacts on the same side.

In the following description, for the purposes of explanation, specific details are set forth in order to provide a thorough understanding of the invention. However, it will be apparent that the invention may be practiced without these specific details. For example, the conductivity type (n- and p-type) can be reversed accordingly for p-channel devices. The same or similar techniques used to form Wafer Level Chip Scale Packaging (WLCSP) can be applied to transistors other than MOSFET devices, such as for example, IGBT (Insulated-Gate Bipolar Transistor), BJT (Bipolar Junction Transistor), JFET (Junction Field Effect Transistor), SIT (Static Induction Transistor), BSIT (Bipolar Static Induction Transistor), Thyristors, etc.

Embodiments of the present invention provide techniques for fabricating WLCSP devices with transistors, preferably vertical transistors, having source, drain and gate contacts on one side of the transistor while still having excellent electrical performance with very low drain-to-source resistance $R_{DS}$(on). These techniques include fabricating the WLCSP using a two metal drain contact technique, a drain contact through-silicon-via (TSV) technique, and a metal on drift region technique.

First embodiments provide a system and method of fabricating a WLCSP that includes a transistor that has a source contact and a drain contact, a first metal layer and a second metal layer. The source contact and the drain contact are disposed on the same side of the transistor. The first metal layer includes a first metal source layer coupled (electrically connected) to a source region of the transistor, and a first metal drain layer coupled (electrically connected) to a drain region of the transistor. The first metal source layer and the first metal drain layer are electrically insulated from each other. The second metal layer includes a second metal source layer coupled (electrically connected) to the source contact and the first metal source layer, and a second metal drain layer coupled (electrically connected) to the drain contact and the first metal drain layer. The second metal source layer and the second metal drain layer are electrically insulated from each other. The first metal source layer, the first metal drain layer, the second metal source layer, and the second metal drain layer are interleaved and form a reduced conduction path length between the source contact and the drain contact. The WLCSP further includes a gate structure, a well region, a drift region disposed adjacent and under the well region and directly on a substrate, and a conduction path. The conduction path extends vertically from the drain contact to the substrate, laterally through the substrate, and vertically from the substrate through the drift region to the source contact. The transistor can be a vertical MOSFET.

Second embodiments also provide a system and method of fabricating a WLCSP, which uses through substrate vias to improve $R_{DS}(on)$. In addition to the feature provided in the first embodiments, these second embodiments provide a through-silicon-via (TSV). The TSV couples (electrically connects) a drain region of the vertical transistor to a back metal disposed on the side of the substrate opposite the source and drain contacts. These second embodiments can also provide a partial-substrate-via (PSV), which can be in addition to the TSV or as an alternative to using a TSV. The PSV is disposed under a source region of the vertical transistor and is coupled (electrically connected) to the back metal. The WLCSP further includes a gate structure, a well region, a drift region disposed adjacent and under the well region and directly on a substrate, and a conduction path. The conduction path extends vertically from the drain contact through the TSV to the substrate, laterally through the substrate, vertically from the substrate through the PSV to the drift region, and vertically from the PSV to the source contact.

Third embodiments also provide a system and method of fabricating a WLCSP, which uses a metal, such as copper, closely connected to the drain drift region to improve $R_{DS}(on)$. In addition to the feature provided in the first embodiments, these third embodiments provide a third metal layer, which can be copper that is disposed under the source and drain of the transistor. The third metal layer can also be disposed on a carrier and is bonded to the transistor on the side opposite the source contact and the drain contact. The WLCSP further includes a gate structure, a well region, a drift region disposed adjacent and under the well region and on the third metal, and a conduction path. The conduction path extends vertically from the drain contact to the third metal, laterally through the third metal, and vertically from the third metal through the drift region to the source contact.

FIG. 1A is an illustration showing a cross-sectional view of a portion of an exemplary n-type trench power MOSFET 100, in accordance with an embodiment. MOSFET 100 includes trenches 102 that extend from the top surface of the substrate through a p-type well or body region 104, terminating in an n-type drift or epitaxial region 106. Gate trenches 102 are lined with thin dielectric layers 108 and are substantially filled with conductive material, such as doped polysilicon, to form a gate 110. The gate structure includes the gate trenches 102, dielectric layer 108 and gate 110. N-type source regions 112 (also referred to as source) are formed inside body region 104 adjacent to trenches 102. The n-type drift or epitaxial region 106 is formed over a heavily-doped n+ substrate region 114. A first metal layer (Metal 1), is formed over the top of the structure, which includes a first portion 116A of Metal 1 that makes electrical contact with the source regions 112 (as shown) as well as electrical contact with the gate 110 (not shown in this cross section), and drain region 120. As explained with reference to FIG. 1B, the Metal 1 layer can include different insulated metal layers which are electrically coupled to the source, drain or gate. A p+ heavy body region 118 is formed inside the p– well 104. The MOSFET 100 also can be divided into active regions and edge regions. The structure shown in the active region of FIG. 1A is repeated many times on a common substrate made of, for example, silicon, to form an array of transistors. The array may be configured in various cellular or striped architectures known in this art. The edge region shown in FIG. 1A includes the n-type drift or epitaxial region 106, the heavily-doped n+ substrate region 114, a second portion 116B of first metal layer (Metal 1) (only the portion the Metal 1 layer which couples to the drain is shown in this cross section), and a drain via region 120 (also referred to as drain). The drain via region 120 is electrically connected to the second portion 116B of the Metal 1 layer. The edge region may be placed between and at the edges of the array of transistors.

When MOSFET 100 is turned on, a conduction path 122 is formed as represented by the dashed curves illustrated in FIG. 1A. The conduction channel 122 begins at source regions 112 and extends along the walls of gate trenches 102 vertically downward into and through the drift region 106 into the substrate 114, and then horizontally in the substrate 114 across the active region and into the edge region and ending at the drain region 120. The $R_{DS}(on)$, which occurs when MOSFET 100 is turned ON, is the resistance that conduction current is subjected to when the source region 112 and drain region 120 are connected by the MOSFET channel. The $R_{DS}(on)$ is proportional to the distance between the source region and the drain region that the current travels along the conduction path 122. The resistance along the conduction path between the source region and the drain region includes contributions from several components including the resistance between the source regions 112 and the drift region 106, the resistance in the drift region 106, the resistance in the substrate 114 along the horizontal portion of the conduction path 122, and the resistance in the drain 120, as illustrated in FIG. 1A. In the embodiment illustrated in FIG. 1A the horizontal portion of the conduction path 122 is along the substrate 114. In other embodiments the horizontal portion of the conduction path 122 can be along a metal layer, as further discussed with reference to FIGS. 4A-4B. Other embodiments can have vias which contribute to the conduction path, as further discussed with reference to FIGS. 3A-3B.

$R_{DS}(on)$ can be reduced by reducing the resistance of any of these components. For example, if packaging limitations are not a problem then the drain 120 can be placed on the opposite side of the source region under the substrate 114 so that the distance the current travels inside the drift region 106 is minimized. Although this configuration has a short conduction path and therefore a low $R_{DS}(on)$, it has the drawback of placing the drain and source regions on opposite sides of the substrate making the overall packaged MOSFET 100 incompatible with a WLCSP.

According to embodiments of the present invention, $R_{DS}(on)$ is reduced by reducing the distance between laterally spaced source regions, and drain regions. Reducing the distance between the source and the drain reduces the horizontal portion of the conduction path 122 in the substrate 114, which reduces the overall $R_{DS}(on)$.

Figure 1B:
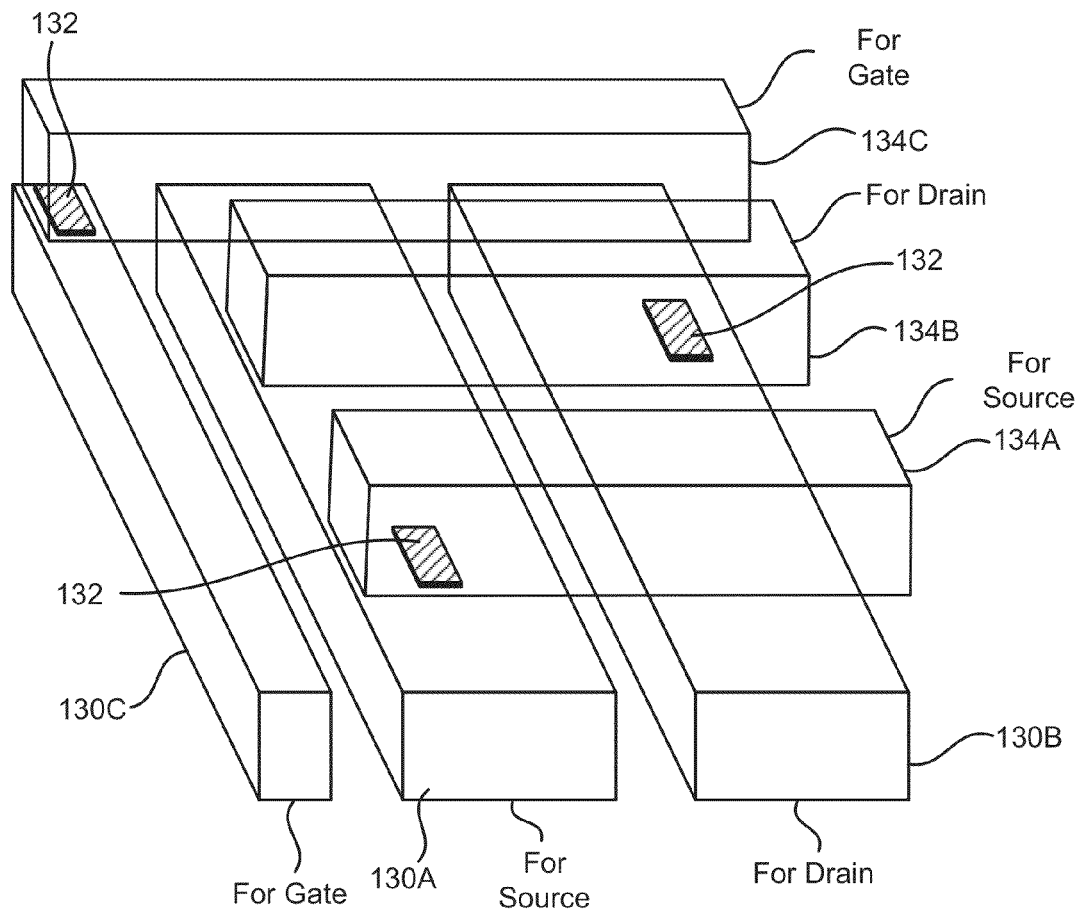
FIG. 1B is an illustration showing a two metal drain contact WLCSP with interleaved metal 1 and metal 2, according to an embodiment.

FIG. 1B illustrates a two metal drain contact WLCSP which includes a first metal layer (metal 1) 130, a via layer 132, and a second metal layer (metal 2) 134. Metal 1 (130) layer can be separated into at least three insulated metal layers (metal 1 source 130A, metal 1 drain 130B, and metal 1 gate 130C). The metal 1 source layer 130A is coupled to the source of a transistor, the metal 1 drain layer 130B is coupled to the drain of a transistor and the metal 1 gate layer 130O is coupled to the gate of the transistor. Similarly, metal 2 (134) layer can be separated into at least three insulated metal layers (metal 2 source 134A, metal 2 drain 134B, and metal 2 gate 134C). The metal 2 source layer 134A is coupled to the source regions of metal 1, the metal 2 drain layer 134B is coupled to the drain regions of metal 1, and the metal 2 gate layer 134C is coupled to the gate regions of metal 1.

Metal 1 (130) and metal (134) are separated by a via layer 132 which includes various through holes that allow the different parts of the metal 2 (134) layer to contact the appropriate parts of the metal 1 (130) layers. For example, a via layer 132 provides electrical contact between the metal 1 source layer 130A, which connects to the source region, and the metal 2 source layer 134A, which connects to the source contacts. Similarly, a via layer 132 provides electrical contact between the metal 1 drain layer 130B, which connects to the drain, and the metal 2 drain layer 134B, which connects to the drain contacts. Also, the via layer 132 provides electrical contact between the metal 1 gate layer 130C, which connects to the gate, and the metal 2 gate layer 134C, which connects to the gate contacts. In one embodiment, the metal 1 layer (130) and metal 2 layer (134) are interleaved to reduce the average distance that current travels (e.g., the conduction path) between the source region and the drain region. Reducing the conduction path between the source and the drain regions reduces $R_{DS}(on)$.

FIGS. 2A-2E illustrate an embodiment having a two metal drain contact WLCSP that is configured with a vertical transistor (e.g. MOSFET) device having source and drain contacts on the same side. $R_{DS}(on)$ is reduced by reducing the lateral component of the resistance caused by the horizontal portion of the conduction path 122 (shown in FIG. 1A) in the substrate 214. The embodiment illustrated in FIGS. 2A-2E reduce the lateral component of the resistance caused by the horizontal portion of the conduction path in the substrate 214 by using a two metal structure pattern with the drain and source regions connected by via layers.

Figure 2A:
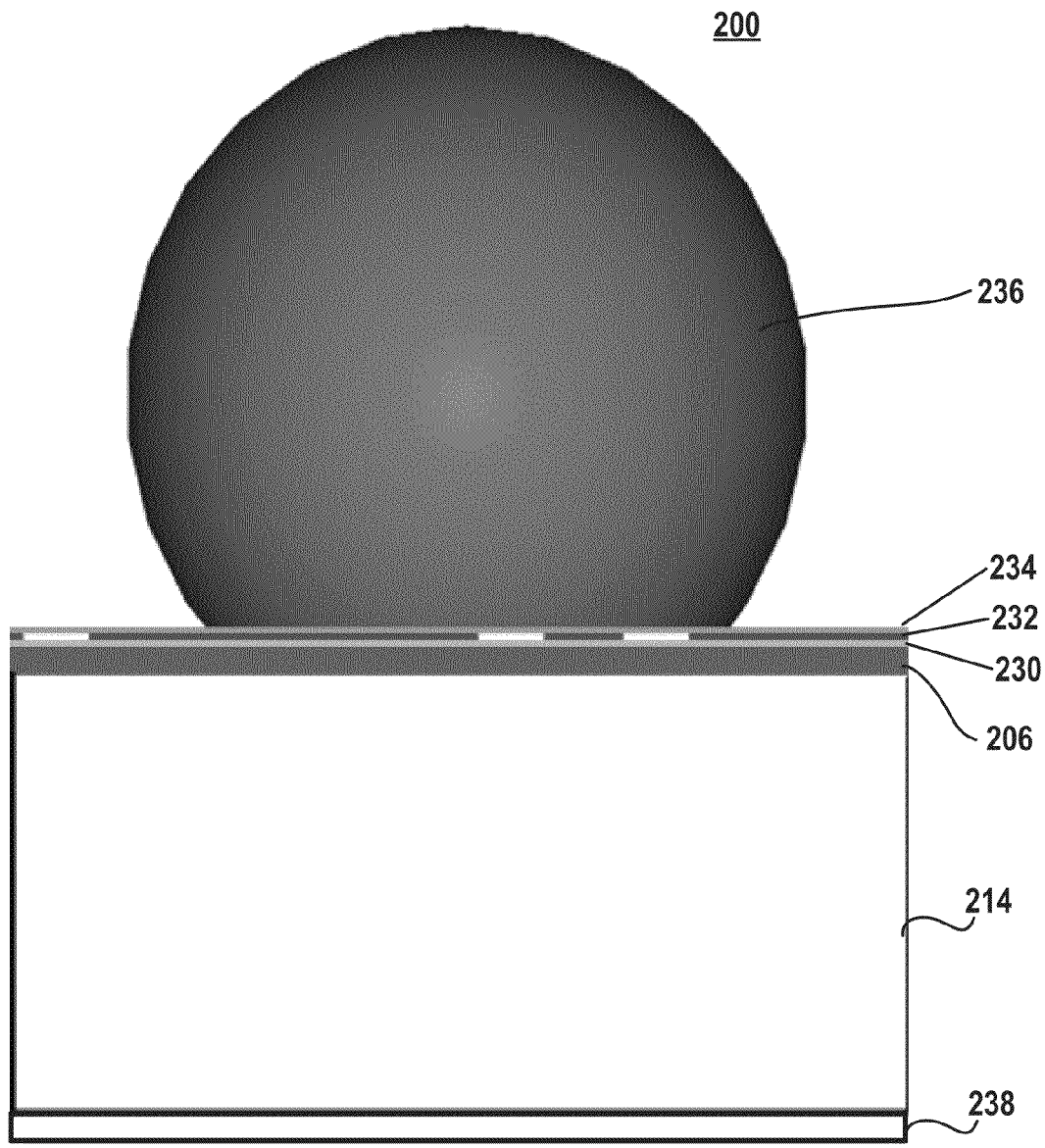
FIGS. 2A-2E are illustrations showing how a two metal drain contact WLCSP is configured with a vertical transistor device having source and drain contacts on the same side, according to an embodiment.

FIG. 2A illustrates a cross section of a two metal WLCSP 200 including a drift region 206, a substrate 214, a first metal layer (metal 1) 230, a via 232, a second metal layer (metal 2) 234, a contact solder ball 236 and a back metal 238. The drift region 206 can be an n-type drift or epitaxial region that rests on top of a substrate 214, which can be a heavily-doped n+ region. The substrate 214 can have a thickness ranging from 1-500 µm and rests over the back metal 238. The back metal 238 can be made of TiNiAg and can have a thickness ranging from 1-20 µm. The solder balls 236 can be made of solderable material and can range in size from 20-500 µm. Alternatively, a flat solder pad can be used instead of a solder ball.

First metal layer (metal 1) 230 can be made of a conductive material such as aluminum that is deposited on top of the drift region 206. The drift region 206 can include the source region, drain region and gate region of the MOSFET. Metal 1 (230) can be made up of several insulated parts that each connect to different parts of the transistor. For example, metal 1 (230) can include a first metal source layer coupled to a source region of the transistor, a first metal drain layer coupled to a drain region of the transistor, and a first metal gate layer coupled to the gate region. The source, drain and gate contacts of a transistor are disposed below metal 1 (230) so that the different parts of metal 1 (230) are connected to the appropriate component. The thickness of metal 1 and metal 2 can range from 0.8-15 µm.

Metal 1 (230) and metal 2 (234) are connected by the via layer 232. Via layer 232 includes different passages or vias to connect the upper deposited layers with different buried structures, as is further described with reference to FIG. 2B. The via layer 232 also has a thickness ranging from 0.5-2 µm. Second metal layer (metal 2) 234 can be made of a conductive material, such as aluminum, that is deposited on top of the via 232 and has connections to the source region, gate and drain region though the vias, which can penetrate to metal 1 (230). Metal 2 (234) can include a second metal source layer coupled to a source contact of the transistor, a second metal drain layer coupled to a drain contact of the transistor, and a second metal gate layer coupled to the gate contact. Solder ball 236 can be electrically connected to any one of the parts of metal 2 (234) depending on whether the solder ball 236 is an electrical contact for the source region, gate, or drain region. The source, drain and gate connections to the MOSFET are disposed below metal 1 (230) and the source, drain and gate contacts to the external terminals are disposed above metal 2 (234). The source, drain and gate contacts to external terminals can be done using bumps or solder balls 236. Since the distance between drain and source is very short, $R_{DS}(on)$ is reduced. The $R_{DS}(on)$ is determined by the conduction path which extends vertically from the drain contact solder ball to the substrate 214, laterally through the substrate 214, and vertically from the substrate 214 through the drift region 206 to the source contact solder ball.

Figure 2B:
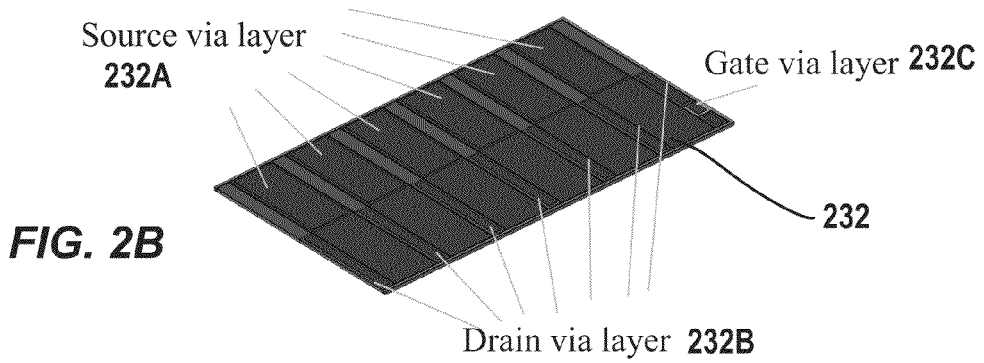

FIG. 2B is an illustration of the via layer 232 including the source via layer 232A, the drain via layer 232B and the gate via layer 232C. The source via layer 232A includes openings that allow the different parts of the metal 2 (234) layer (not shown) to contact the appropriate parts of the metal 1 (230) layers. For example, the via layer 232 includes the source via layer 232A, which provides electrical contact between the part of metal 1 (230) that connects to the source region and the part of the metal 2 (not shown) that connects to the source contacts. Similarly, the via layer 232 includes the drain via layer 232B, which provides electrical contact between the part of metal 1 (230) that connects to the drain and the part of the metal 2 (not shown) that connects to the drain contacts. Via layer 232 also includes the gate via layer 232C, which provides electrical contact between the part of metal 1 (230) that connects to the gate and the part of the metal 2 (not shown) that connects to the gate contacts. Metal 1 (230) and metal 2 (not shown) can be interleaved as illustrated in FIG. 1B to reduce the average distance that current travels (e.g., the conduction path) between the source and drain regions. Reducing the conduction path between the source and the drain reduces $R_{DS}(on)$.

Figure 2C:
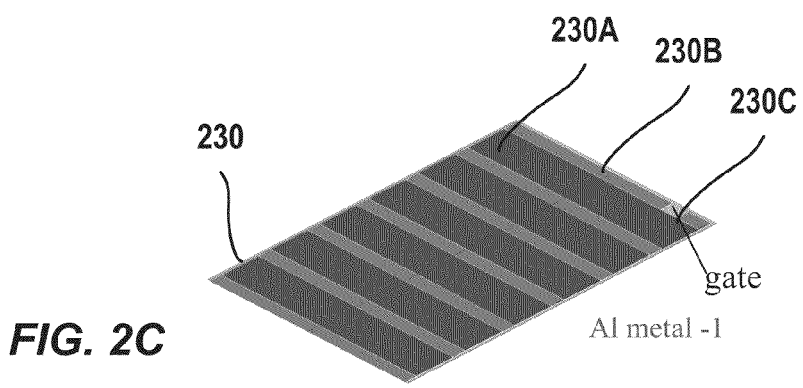
Figure 2D:
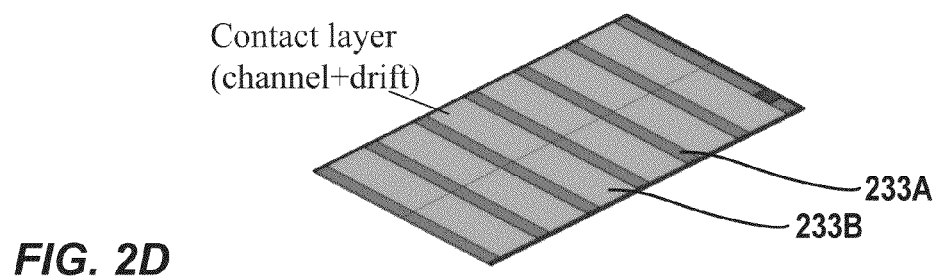

FIG. 2C illustrates the metal 1 (230) layer having a metal 1 source 230A, a metal 1 drain 230B and a metal it gate 230C. The metal 1 source 230A electrically connects to the source regions 112 and provides the source current for the transistor 100. The metal 1 drain 230B electrically connects to the drain 120 of the transistor 100 while the metal 1 gate 230C electrically connects to the gate 110 of the transistor 100. The metal 1 source 230A and metal 1 drain 230B can be arranged as strips that are separated by a distance that is less than 250 µm. FIG. 2D, which illustrates the same pattern as FIG. 2C, shows an arrangement of the source and drain regions in the WLCSP 200 structure including the drain region location 233A and the source region location 233B. The metal 1 source 230A, the metal 1 drain 230B and the metal 1 gate 230C layers, illustrated in FIG. 2C, are connected to the corresponding metal 2 source (234A), metal 2 drain (234B), and metal 2 gate (234C) regions, illustrated in FIG. 2E, dependant on the via arrangement in FIG. 2B.

Figure 2E:
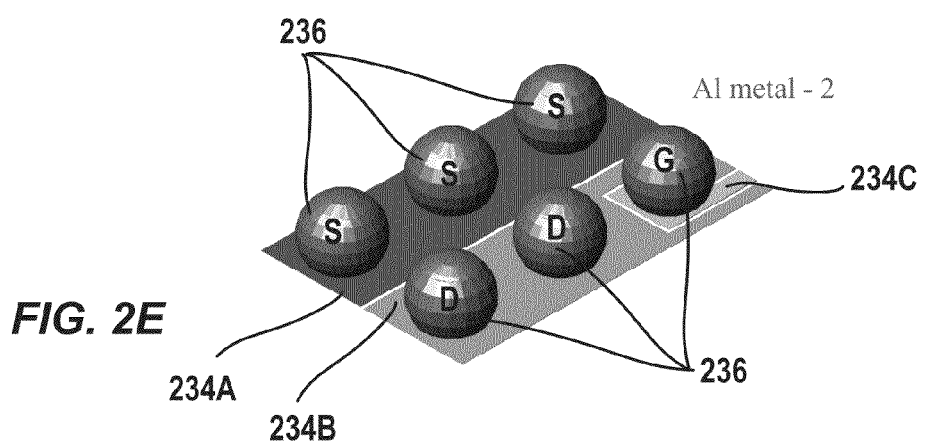

FIG. 2E is a perspective view of an embodiment having a two metal drain contact WLCSP including metal 2 (234) layer (with metal 2 source 234A, metal 2 drain 234B, and metal 2 gate 234C), and solder balls 236. The solder balls 236 are electrically connected to the metal 2 source 234A, metal 2 drain 234B, and metal 2 gate 234C. In one embodiment, three solder balls 236 are electrically connected to the metal 2 source 234A, two solder balls 236 are electrically connected to the metal 2 drain 234B and one solder ball 236 is electrically connected to the metal 2 gate 234C. One purpose of metal 2 is to gather the current from metal 1 and have large enough dimensions to fit the solder ball 236 on top. Metal 1 (230) and metal 2 (234) are electrically insulated from each other and are placed over each other so that the metal 1 source, metal 2 source, metal 1 drain, and metal 2 drain layers are interleaved. Interleaving these different parts of the metal 1 and metal 2 layers reduces the source to drain distance (conduction path) resulting in a reduced $R_{DS}(on)$. Further, since the electrical contacts to the transistor are made via the solder balls 236 and the solder balls 236 are all disposed on the same side of the WLCSP, reducing the $R_{DS}(on)$ improves the performance of the WLCSP. In one embodiment, the back metal of the WLCSP device is 0.7 μm, and the $R_{DS}(on)$ of the WLCSP device is less than 11.5 mΩ-mm² when the device is turned ON.

Figure 3A:
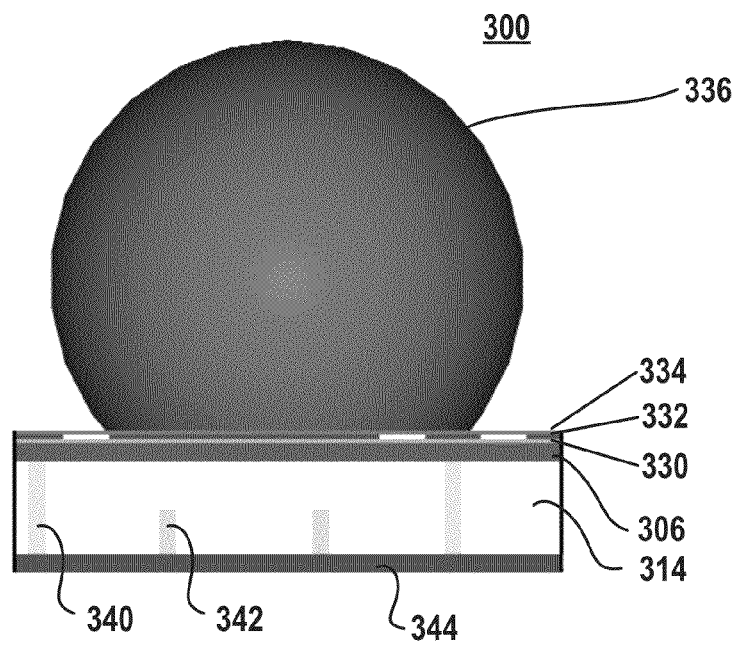
FIGS. 3A-3B are illustrations showing how a two metal drain contact WLCSP, using through substrate vias, is configured with a vertical transistor device having source and drain contacts on the same side, according to an embodiment.

FIG. 3A illustrates a cross section of a two metal WLCSP 300 using through substrate vias that includes a drift region 306, a substrate 314, a first metal layer (metal 1) 330, a via 332, a second metal layer (metal 2) 334, a contact solder ball 336, a through-silicon-via (TSV) 340, a partial-substrate-via (PSV) 342, and a back metal 344. In some embodiments the PSV 342 is not used and the WLCSP 300 includes the TSV 340 without the PSV 342. The drift region 306 can be an n-type epitaxial drift region which rests on top of a substrate 314 which can be a heavily-doped n+ region. The substrate 314 can have a thickness ranging from 1-200 μm and rests over a back metal 344. The back metal 344 can be made of conductive materials, such as copper, and can have a thickness ranging from 1-20 μm. The solder balls 336 can be made of solderable material and can range in size from 20-500 μm.

First metal layer (metal 1) 330 can be made of a conductive material, such as aluminum, that is deposited on top of the drift region 306, which can include the source, drain and contacts of the transistor. Metal 1 (330) can be made up of several insulated parts that each connect to different parts of the transistor. For example, metal 1 (330) can include a first metal source layer coupled to a source region of the transistor, a first metal drain layer coupled to a drain region of the transistor, and a first metal gate layer coupled to the gate region. The source, drain and gate contacts of a transistor are disposed below metal 1 (330) so that the different parts of metal 1 (330) are connected to the appropriate component. The thickness of metal 1 and metal 2 can range from 0.8-15 μm.

Metal 1 (330) and metal 2 (334) are connected by the via layer 332. Via layer 332 includes different passages or vias to connect the upper deposited layers (e.g., metal 2 layers) with different underlying structures (e.g., metal 1 layers), as is further described with reference to FIG. 2B. The via layer 332 also has a thickness ranging from 0.5-2 μm. Second metal layer (metal 2) 334 can be made of a conductive material, such as aluminum, that is deposited on top of the via layer 332 and has connections to the source region, gate and drain region through the vias to metal 1 (330). Metal 2 (334) can include a second metal source layer coupled to a source contact of the transistor, a second metal drain layer coupled to a drain contact of the transistor, and a second metal gate layer coupled to the gate contact. Solder ball 336 can be electrically connected to any one of the parts of metal 2 (334) depending on whether the solder ball 336 is an electrical contact for the source region, gate, or drain region. The source, drain and gate connections to the transistor e.g. MOSFET) are disposed below metal 1 (330) and the source, drain and gate contacts to the external terminals are disposed above metal 2 (334). The source, drain and gate contacts to external terminals can be done using flat surface pads, bumps or solder balls 336. Since the distance between the drain and source regions is short, $R_{DS}(on)$ is reduced. The $R_{DS}(on)$ is determined by the conduction path which extends vertically from the drain contact through the TSV 340 to the substrate 314, laterally through the substrate 314, vertically from the substrate 314 through the PSV 342 to the drift region 306, and vertically from the PSV 342 to the source contact. In another embodiment, where a TSV 340 is used but a PSV 340 is not used, the conduction path extends vertically from the drain contact through the TSV 340 to the back metal 344, laterally through the back metal 344, and vertically from the back metal 344 to the source contact.

TSV 340 are formed in the substrate 314 and are connected to the drain region 120 and the back metal 344, which is disposed on the side of the substrate 314 opposite the source contact and drain contact. The TSV 340 is formed all the way through the substrate and is therefore the same thickness as the substrate. Therefore, if the substrate is 1-500 μm thick then the TSV 340 will be 1-500 μm long. Each of the TSV 340 has a diameter ranging from 5-50 μm and a pitch ranging from 10-100 μm. Each of the TSV 340 is filled with a conductive metal such as aluminum or copper, for example. Since the back metal 344 and the TSV 340 can both be conductive (copper, for example), $R_{DS}(on)$ can be significantly reduced because, in this embodiment, the conduction path includes the TSV 340 and the back metal 344, which both have low resistance. The TSV 340 improves the electrical performance by providing a low resistance conduction path.

PSV 342 is formed in the substrate 314 under the source regions 112 and is connected to the back metal 344 but not to the source region 112. The PSV 342 can have a length ranging from 1% the thickness of the substrate 314 up to 99% the thickness of the substrate 314. In one embodiment the length of the PSV 342 is 90% the thickness of the substrate and extends from the back metal 344 towards the source region for half the distance of the substrate 314 thickness. In some embodiments, the length of the PSV 342 is set so that the distance the PSV 342 penetrates through the substrate is maximized without penetrating the drift layer. Each of the PSV 342 has a diameter ranging from 5-50 μm and a pitch ranging from 10-100 μm. Each of the PSV 342 is filled with a conductive metal such as aluminum or copper, for example.

Figure 3B:
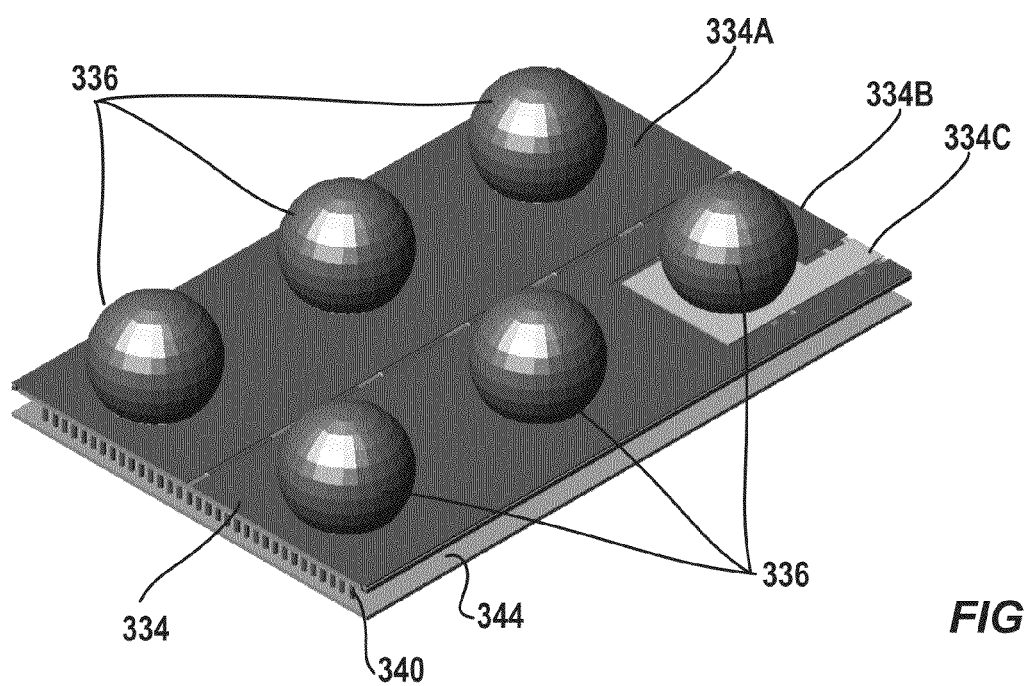
Figure 3C:
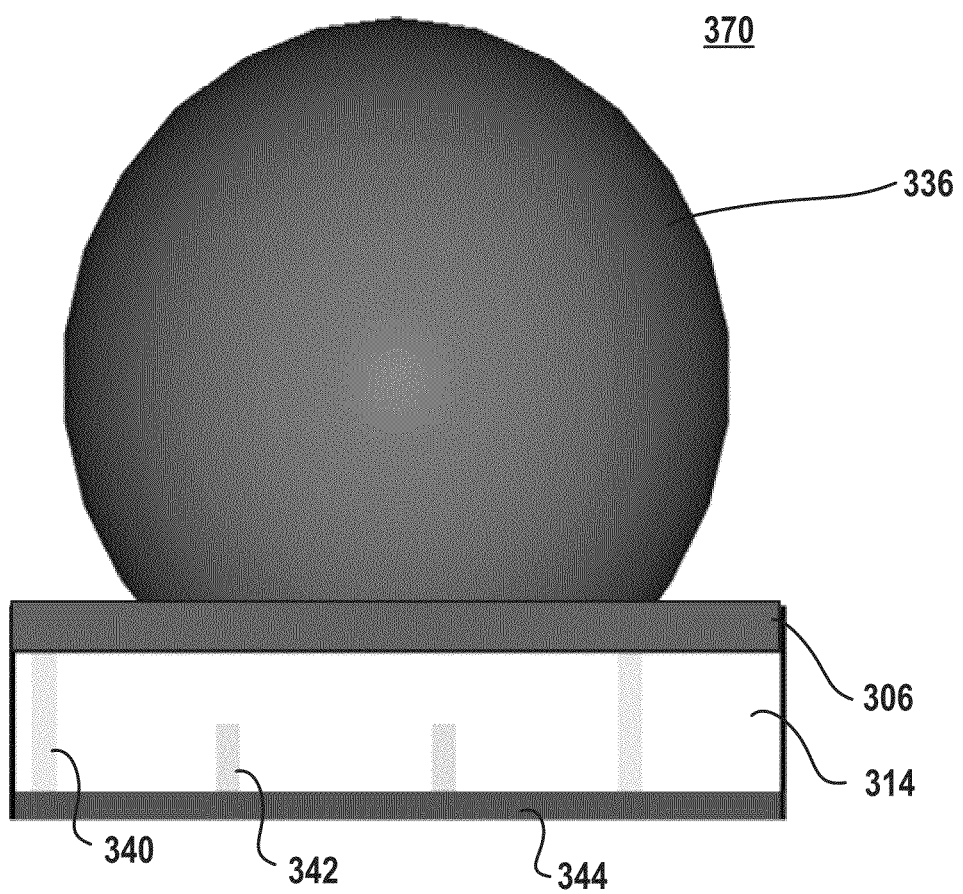
FIG. 3C is an illustration showing how a WLCSP, using through substrate vias without the two metal structure shown in FIGS. 3A-3B, is configured with a vertical transistor device having source and drain contacts on the same side, according to an embodiment.

FIG. 3C illustrates an alternate embodiment where the WLCSP 370 includes the TSV 340 but does not include the first metal 1 (330), via 332, and metal 2 (334). In this embodiment, the WLCSP 300 includes the drift region 306, the substrate 314, the contact solder ball 336, the TSV 340, the PSV 342, and the back metal 344. In some embodiments the PSV 342 is not used and the WLCSP 370 includes the TSV 340 without the PSV 342. The drift region 306 can be an n-type epitaxial drift region which rests on top of a substrate 314 which can be a heavily-doped region. The drift region 306 can include the source, drain and gate regions as well as the contacts of the transistor. The substrate 314 can have a thickness ranging from 1-200 μm and rests over a back metal 344. The back metal 344 can be made of conductive materials, such as copper, and can have a thickness ranging from 1-20 μm. The solder balls 336 can be made of solderable material and can range in size from 20-500 μm. Solder ball 336 can be electrically connected to any one of the source, gate, or drain regions of the transistor (e.g. MOSFET). The source, drain and gate contacts to external terminals can be done using flat surface pads, bumps or solder balls 336. The TSV 340, PSV 342 and hack metal 344 are substantially the same as in the WLCSP discussed with reference to FIGS. 3A-3B.

The use of the TSV 340 and/or PSV 342 reduces the resistance between the back metal and the drift region 306. The resistivity is reduced because the resistance of the TSV 340 and/or PSV 3.42 material is lower than the resistance of the substrate 314. The $R_{DS}(on)$ is determined by the conduction path, which extends vertically from the drain contact through the TSV 340 to the back metal 344, laterally through the back metal 344, and vertically from the back metal 344 to the source contact. The use of both the TSV 340 and the PSV 342 also contribute to a reduction in resistance between the drain and source. If both the TSV 340 and the PSV 342 are used the conduction path can have several branches. A first branch of the conduction path extends vertically from the drain contact through the TSV 340 to the back metal 344, laterally through the back metal 344, and vertically from the back metal 344 to the source contact. A second branch of the conduction path extends vertically from the drain contact through the TSV 340 to the back metal 344, laterally through the back metal 344, and vertically from the back metal 344 through the PSV 342 to the source contact. Those skilled in the art will realize that there are other conduction paths, which are formed according to the resistances and voltage potentials of each of the components. The $R_{DS}$(on) of the conduction path is determined by adding all of the branches, either in parallel or in series, depending on the configurations.

FIG. 3B is a perspective view of the two metal drain contact WLCSP 300 using through substrate vias that includes metal 2 (334) layer (with metal 2 source 334A, metal 2 drain 334B, and metal 2 gate 334C), solder balls 336, through-silicon-vias (TSV) 340, and back metal 344. The solder balls 336 are electrically connected to the metal 2 source 334A, metal 2 drain 3349, and metal 2 gate 334C. In one embodiment, three solder balls 336 are electrically connected to the metal 2 source 334A, two solder balls 336 are electrically connected to the metal 2 drain 334B and one solder ball 336 is electrically connected to the metal 2 gate 334C. The placement of the metal 2 source 334A and metal 2 drain 33413 is interspersed to reduce the distance between the source and drain regions so that the conduction path is reduced and therefore the $R_{DS}$(on) is reduced. The placement of the metal 1 source 330A and the metal 1 drain 3309 is also interspersed to reduce the distance between the source and drain. Metal 1 (330) and metal 2 (334) are electrically insulated from each other and are placed over each other so that the metal 1 source, metal 2 source, metal 1 drain, and metal 2 drain layers are interleaved. Interleaving these different parts of the metal 1 and metal 2 layers reduces the source to drain distance (conduction path) resulting in a reduced $R_{DS}$(on). The drain 120 is also connected to the back metal 344 through the TSAI 340, which reduces the resistance of the conduction path and reduces the $R_{DS}$/on). Further, since the electrical contacts to the transistor are made via the solder balls 336 and the solder balls 336 are all disposed on the same side of the WLCSP, reducing the $R_{DS}$(on) improves the performance of the WLCSP. In one embodiment, the back metal of the WLCSP device is 10 μm, and the $R_{DS}$(on) of the WLCSP device is less than 8 mΩ-mm² when the device is turned ON.

Figure 4A:
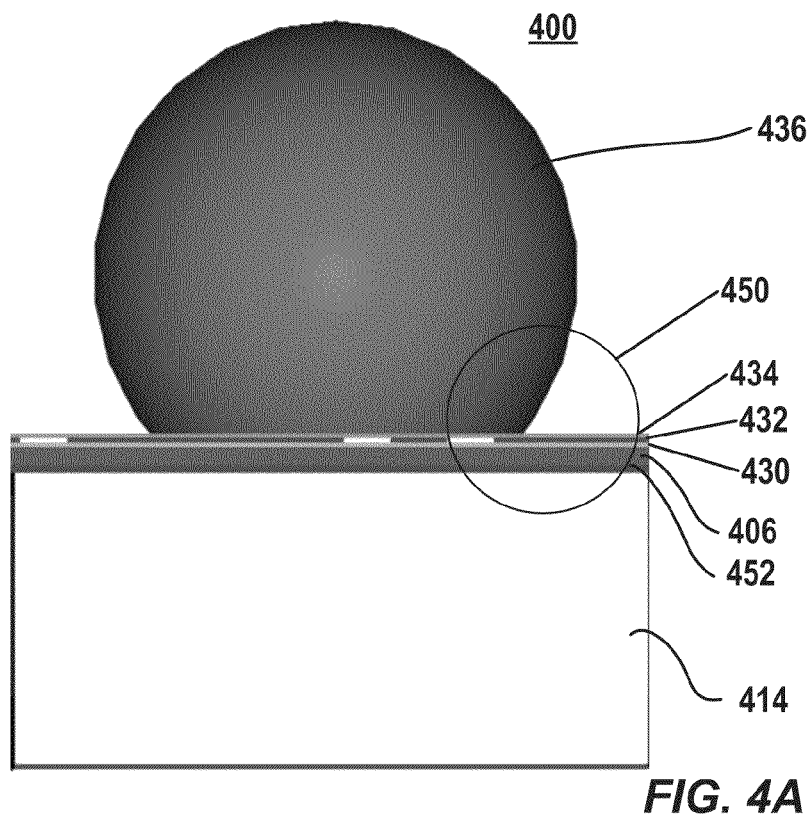
FIGS. 4A-4B are illustrations showing how a two metal drain contact WLCSP, using metal closely connected to the drain drift region, is configured with a vertical transistor device having source and drain contacts on the same side, according to an embodiment.
Figure 4B:
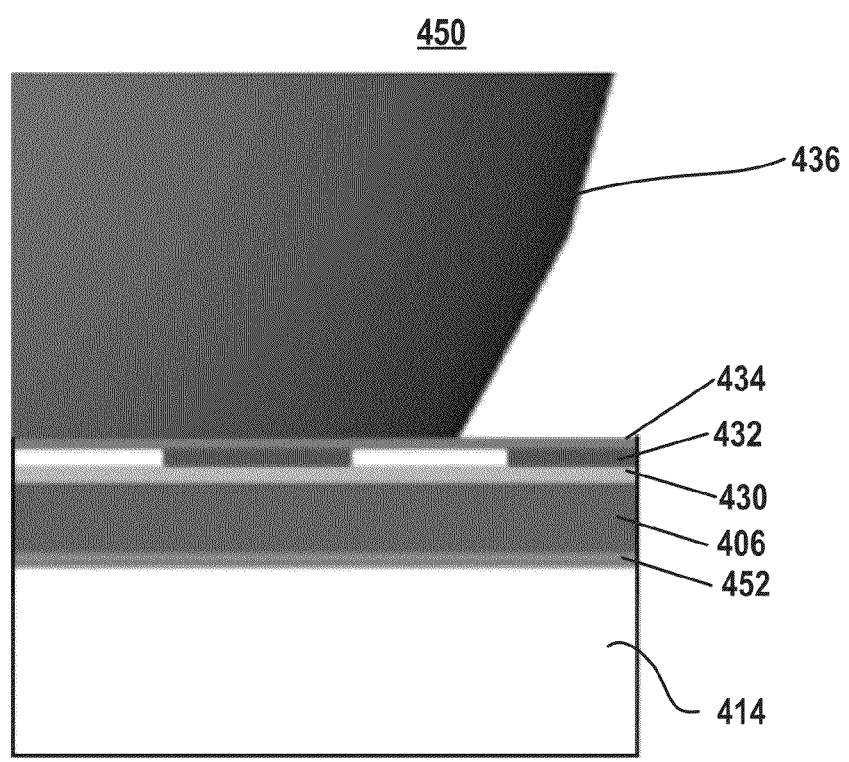

FIGS. 4A and 4B illustrate a cross section of a two metal drain contact WLCSP 400 using metal (such as copper) closely connected to the drift region that includes a drift region 406 (a thin intervening substrate element between the drift region and copper layer is not illustrated), a carrier 414, a first metal layer (metal 1) 430, a via 432, a second metal layer (metal 2) 434, a contact solder ball 436, and a third metal (copper layer) 452 closely connected to the drift region. Copper layer 452 can be deposited or plated on a very thin substrate (thickness ranging from 1-15 μm) that has an epi drift region on top. FIG. 4B is an exploded view of the circular region identified as 450 in FIG. 4A. The drift region 406 can be an epitaxial n-type drift region on top of a thin substrate portion (1-15 μm) not shown. The carrier 414, which can have a thickness ranging from 10-200 μm, mechanically supports the layers and structures formed on top and can have predetermined thermal, electrical, and mechanical properties as suited for a particular application. The carrier 414 can be ceramic, silicon, glass, or metal, etc. For example, the carrier 414 can be a wafer that is made of an insulating material, such as a ceramic, which has high thermal conductivity. In other some embodiments, a heat sink can also be attached, directly or indirectly, to the carrier 414 to improve thermal properties of the WLCSP. The carrier 414 can also have a coefficient of thermal expansion that substantially matches the coefficient of thermal expansion of the structure or layers formed on top. The solder balls 436 can be made of solderable material and can range in size from 20-250 μm.

First metal layer (metal 1) 430 can be made of a conductive material, such as aluminum, that is deposited on top of the drift region 406, which can include the source, drain and contacts of the transistor (e.g. MOSFET). Metal 1 (430) can be made up of several insulated parts that each connect to different parts of the transistor. For example, metal 1 (430) can include a first metal source layer coupled to a source region of the transistor, a first metal drain layer coupled to a drain region of the transistor, and a first metal gate layer coupled to the gate region. The source, drain and gate contacts of a transistor are disposed below metal 1 (430) so that the different parts of metal 1 (430) are connected to the appropriate component. The thickness of metal 1 and metal 2 can range from 0.8-15 μm.

Metal 1 (430) and metal 2 (434) are connected by the via layer 432. Via layer 432 includes different passages or vias to connect the upper deposited layers (e.g., metal 2 layers) with different buried structures (e.g., metal 1 layers), as is further described with reference to FIG. 2B. The via layer 432 also has a thickness ranging from 0.5-2 μm. Second metal layer (metal 2) 434 can be made of a conductive material, such as aluminum, that is deposited on top of the via 432 and has connections to the source, gate and drain though the vias which connect to metal 1 (430). Metal 2 (434) can include a second metal source layer coupled to a source contact of the transistor, a second metal drain layer coupled to a drain contact of the transistor, and a second metal gate layer coupled to the gate contact. Solder ball 436 can be electrically connected to any one of the parts of metal 2 (434) depending on whether the solder ball 436 is an electrical contact for the source, gate, or drain. The source, drain and gate connections to the transistor are disposed below metal 1 (430) and the source, drain and gate contacts to the external terminals are disposed above metal 2 (434). The source, drain and gate contacts to external terminals can be done using pads, bumps or solder balls 436. Since the distance between drain and source is short, $R_{DS}$(on) is reduced. The $R_{DS}$(on) is determined by the conduction path which extends vertically from the drain contact to the third metal 452, laterally through the third metal 452, and vertically from the third metal 452 through the drift region 406 to the source contact.

Metal layer (copper layer) 452, which is closely connected to the drain drift region, is directly formed under the source, drain and gate contact layer. In one embodiment, the copper layer 452 is deposited on the structure, which includes transistor (e.g. MOSFET), metal 1, metal 2 and vias, while that structure is upside down. In other embodiments, the metal layer 452 can be attached to the carrier 414, which is a dummy wafer with a layer of copper on top of it. The carrier 414 can be joined to a first wafer containing the structure with the copper back metal layer 452, drift region 406, metal 1 (430), via 432, metal 2 (434), and contact solder ball 436. The carrier 414 is joined to this wafer having the structure just described, so that the metal layer 452 is mechanically bonded to the second wafer. The second wafer can also have a copper metal layer so that the metal layer 452 bonds to the copper back metal layer of the first wafer. The metal layer 452 provides a low resistance conduction path 122 for the transistor device MOSFET). Since the metal layer 452 has low resistance and is closely connected to the transistor, the $R_{DS}$(on) of this configuration is low. In one embodiment, the back metal of the WLCSP device is 0.7 μm, and the $R_{DS}$(on) of the WLCSP device is less than 7 mΩ-mm² when the device is turned ON. The TSV 340 (not shown) improves the electrical performance by providing a low resistance path for conduction through the drift region 406.

Figure 4C:
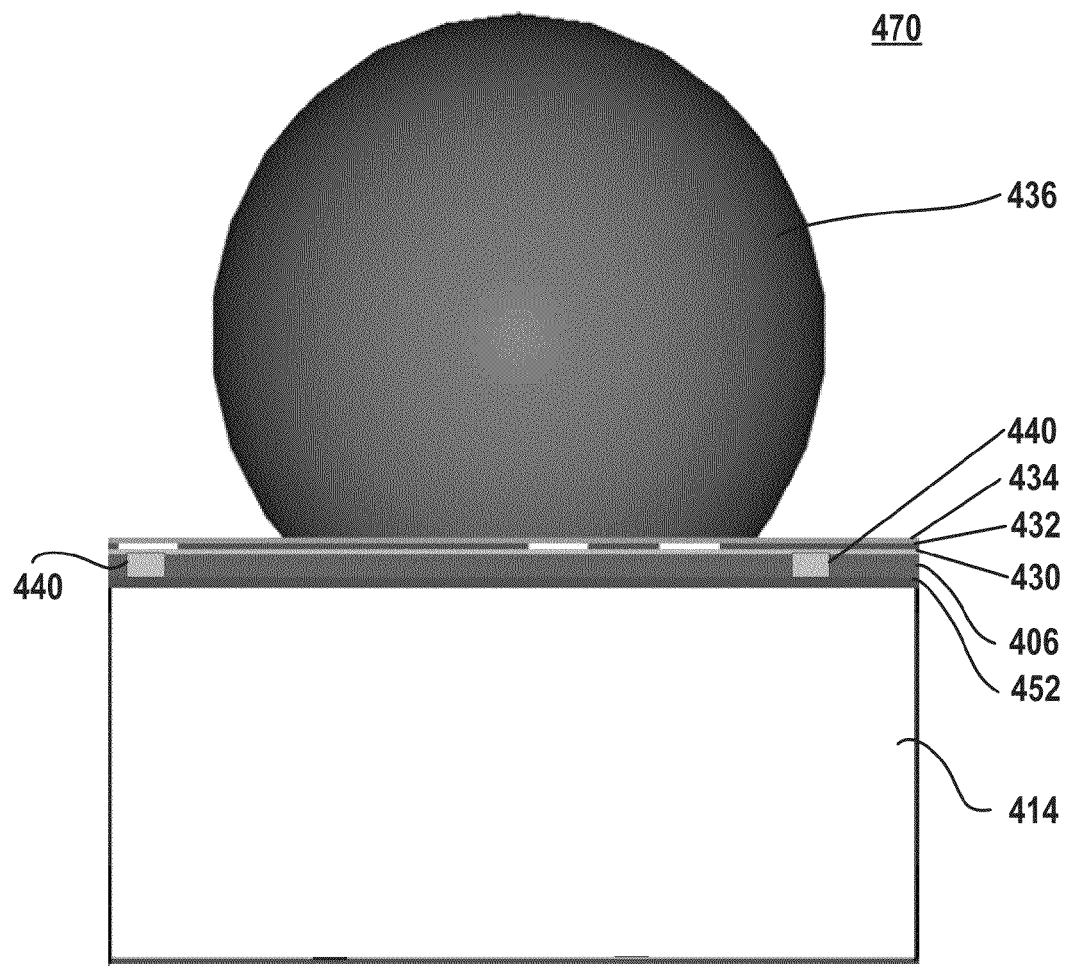
FIG. 4C is an illustration showing how a two metal drain contact WLCSP, using metal closely connected to the drain drift region and through substrate vias, is configured with a vertical transistor device having source and drain contacts on the same side, according to an embodiment.

FIG. 4C illustrates an alternate embodiment of a two metal drain contact WLCSP 470 using metal (such as copper) closely connected to the drift region and through substrate vias. In this embodiment, the WLCSP 470 includes the drift region 406 (a thin intervening substrate element between the drift region and copper layer is not illustrated), the carrier 414, the first metal layer (metal 1) 430, the via 432, the second metal layer (metal 2) 434, the contact solder ball 436, the third metal (copper layer) 452 closely connected to the drift region, and a TSV 440 (two shown). The drift region 406, carrier 414, first metal layer (metal 1) 430, via 432, second metal layer (metal 2) 434, contact solder ball 436, and third metal (copper layer) 452, which is closely connected to the drift region, are substantially the same as in the WLCSP discussed with reference to FIGS. 4A-4B. The TSV 440 connects metal 1 (430) to the embedded third metal (copper layer) 452. TSV 440 is also substantially the same as in the WLCSP discussed with reference to FIGS. 3A-3B. The use of the TSV 440 reduces the resistance between the drain and source.

The $R_{DS}$(on) is determined by the conduction path which can have several branches. A first branch of the conduction path uses the TSV 440 and extends vertically from the drain contact through the TSV 440 to the embedded third metal layer 452, laterally through the embedded third metal layer 452, and vertically from the embedded third metal layer 452 through the TSV 440 to the source contact. A second branch of the conduction path, which will have higher resistance than the first branch, extends vertically from the drain contact through the drift region 406 to the embedded third metal layer 452, laterally through the third metal layer 452, and vertically from the third metal layer 452 through the drift region 406 to the source contact. The second branch will have higher resistance than the first branch because the resistance of the drift region is higher than the resistance of the TSV 440. Those skilled in the art will realize that there are other conduction paths, which are formed according to the resistances and voltage potentials of each of the components in the WLCSP. The $R_{DS}$(on) of all the conduction paths is determined by adding all of the branches, either in parallel or in series, depending on the configurations.

Figure 5:
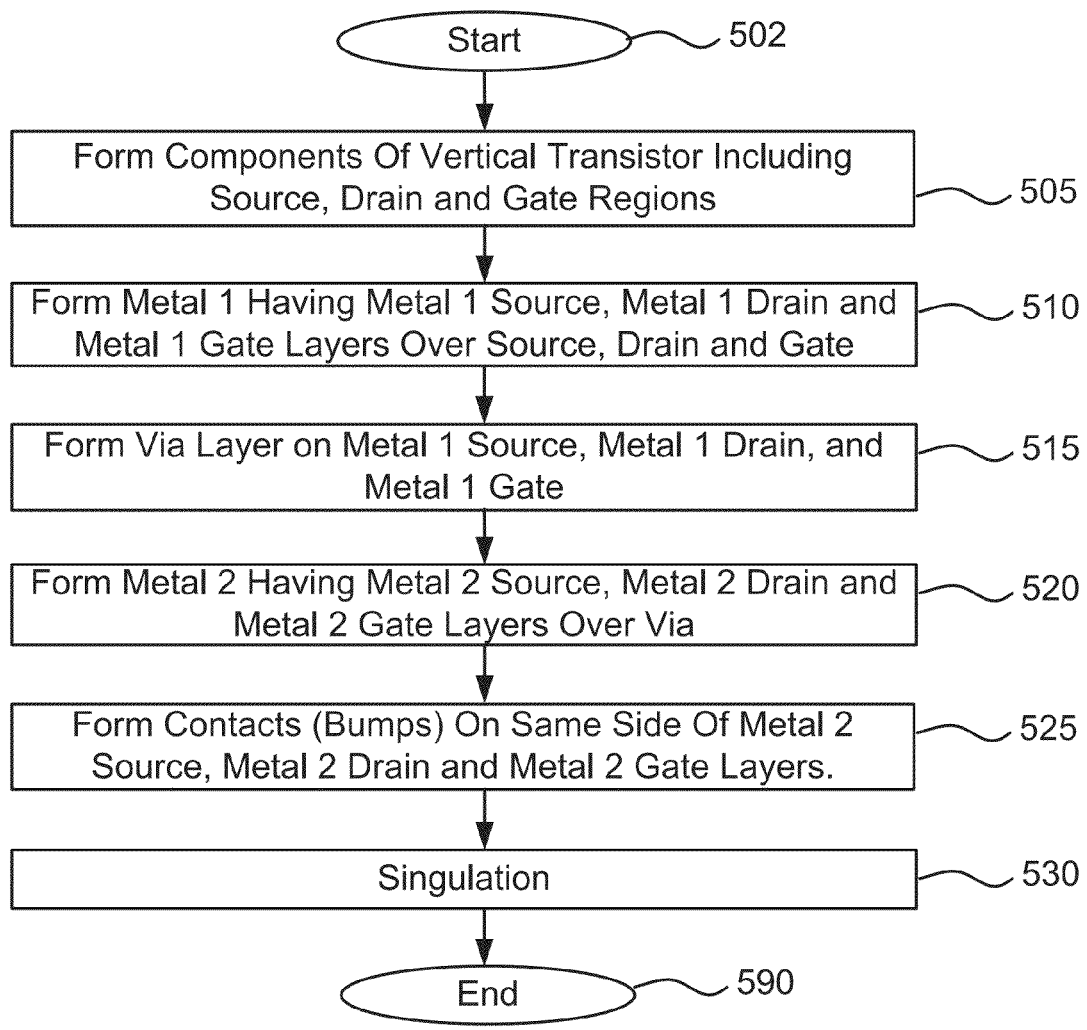
FIG. 5 is a flowchart illustrating a method of fabricating the WLCSP represented in FIGS. 2A-2E for a vertical transistor device with source and drain contacts on the same side and reduced $R_{DS}$(ON), according to another embodiment.

FIG. 5 is a flowchart illustrating a method of fabricating the WLCSP represented in FIGS. 2A-2E for a vertical transistor (e.g., MOSFET) device with source and drain contacts on the same side and reduced $R_{DS}$(on), according to another embodiment. The method starts in operation 502 with a substrate 214, which can have a lightly doped N epitaxial layer. In operation 505, components of the vertical transistor such as the source regions, drain regions, gate regions, and drift regions are formed directly on the substrate 214. These components of the transistor, which are described with reference to FIG. 1, can be formed using known fabrication techniques. Next in operation 510, a first metal layer 230 is formed over the components of the vertical transistor. The first metal layer 230 includes a first metal source layer coupled (electrically connected) to a source region of the transistor and a first metal drain layer coupled (electrically connected) to a drain region of the transistor. The first metal source layer and the first metal drain layer are electrically insulated from each other. The first metal layer 230 can also include a first metal gate layer, which is coupled (electrically connected) to the gate but electrically insulated from both the first metal source layer and the first metal drain layer.

Next in operation 515, a via layer 232 is formed over the first metal layer 230. The via layer 232, which is formed over the first metal source layer, first metal drain layer and first metal gate layer, forms a via pattern to make the proper connections to subsequent layers. The via layer 232 can be formed by depositing an insulating layer, masking the insulating layer and then etching away portions to form the vias. Next in operation 520, a second metal layer 234 is formed over the via layer 232. The second metal layer 234 includes a second metal source layer coupled (electrically connected) to the first metal source layer and a second metal drain layer coupled (electrically connected) to the first metal drain layer. The second metal source layer and the second metal drain layer are electrically insulated from each other. The second metal layer 234 can also include a second metal gate layer, which is coupled (electrically connected) to the gate but electrically insulated from both the second metal source layer and the second metal drain layer. The first metal source layer, the first metal drain layer, the second metal source layer, and the second metal drain layer formed in operations 510 and 515 are interleaved. In operation 525, a source contact and a drain contact are formed on the same side of the vertical transistor. The source contact is coupled (electrically connected) to the second metal source layer, and the drain contact is coupled (electrically connected) to the second metal drain layer. This method forms a WLCSP having a conduction path with reduced $R_{DS}$(on). The $R_{DS}$(on) is determined by the conduction path which extends vertically from the drain contact to the substrate, laterally through the substrate, and vertically from the substrate through the drift region to the source contact, in one embodiment, the source contact and the drain contact are formed to have an $R_{DS}$(on) that is less than 11.6 mΩ-mm² when the device is turned ON. Next in operation 530 the devices are diced up into smaller devices in a process known as singulation. The method ends in operation 590 when the WLCSP is finalized and prepared for mounting onto a circuit board. Operation 590 can include testing and marking as well as other final operations. Once finished, the WLCSP can be directly mounted onto a circuit board by flipping their solder ball features onto the circuit board and soldering.

Figure 6:
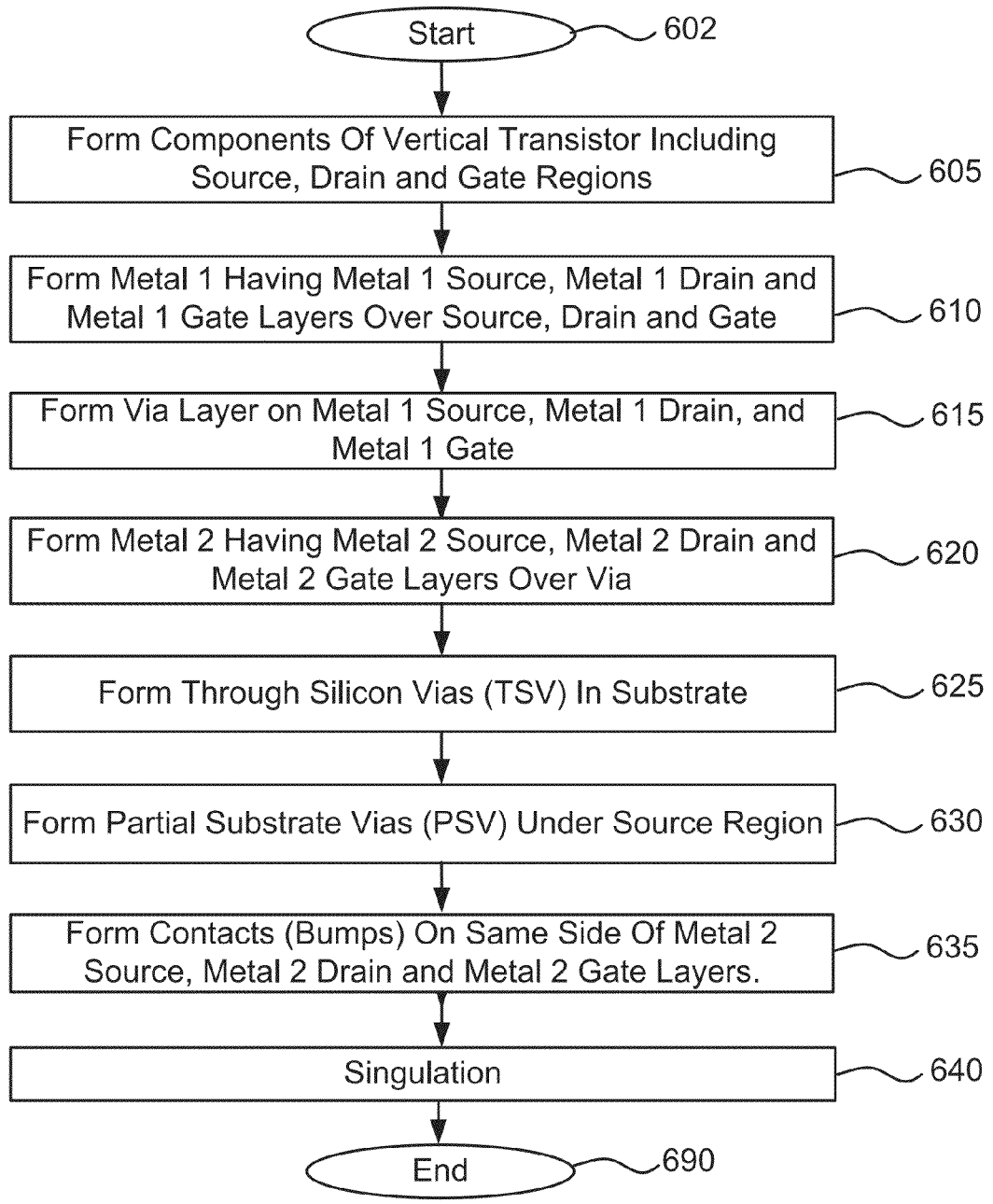
FIG. 6 is a flowchart illustrating a method of fabricating the WLCSP represented in FIGS. 3A-3B for a vertical transistor device with source and drain contacts on the same side and reduced $R_{DS}$(ON), according to another embodiment.

FIG. 6 is a flowchart illustrating a method of fabricating the WLCSP that uses through substrate vias (TSV), represented in FIGS. 3A-3B for a vertical transistor (e.g., MOSFET) device with source contact and drain contact on the same side and reduced $R_{DS}$(N), according to another embodiment. The method starts in operation 602 when a substrate 314, which can have a lightly doped N epitaxial layer, is provided. Next in operation 605, components of the vertical transistor such as the source regions, drain regions, gate regions, and drift regions are formed directly on the substrate 314. These components of the transistor, which are described with reference to FIG. 1, can be formed using known fabrication techniques. Next in operation 610, a first metal layer 330 is formed over the components of the vertical transistor. The first metal layer 330 includes a first metal source layer coupled (electrically connected) to a source region of the vertical transistor and a first metal drain layer coupled (electrically connected) to a drain region of the vertical transistor. The first metal source layer and the first metal drain layer are electrically insulated from each other. The first metal layer 330 can also include a first metal gate layer, which is coupled (electrically connected) to the gate but electrically insulated from both the first metal source layer and the first metal drain layer.

Next in operation 615, a via layer 332 is formed over the first metal layer (metal 1) 330. The via layer 332, which is formed over the first metal source layer, first metal drain layer and first metal gate layer, forms a via pattern to mike the proper connections to subsequent layers. The via layer 332 can be formed by depositing an insulating layer, masking the insulating layer and then etching away portions to form the vias. Next in operation 620, a second metal layer (metal 2) 334 is formed over the via layer 332. The second metal layer 334 includes a second metal source layer coupled (electrically connected) to the first metal source layer and a second metal drain layer coupled (electrically connected) to the first metal drain layer. The second metal source layer and the second metal drain layer are electrically insulated from each other. The second metal layer 334 can also include a second metal gate layer, which is coupled (electrically connected) to the gate but electrically insulated from both the second metal source layer and the second metal drain layer. The first metal source layer, the first metal drain layer, the second metal source layer, and the second metal drain layer formed in operations 610 and 615 are interleaved.

Next in operation 625, TSV are formed. The TSV are coupled (electrically connected) to a drain region of the vertical transistor and to a back metal of the vertical transistor. The back metal of the transistor is disposed on the side of the transistor opposite the source contact and drain contact. Next in operation 630, partial-substrate-vias (PSV) are formed under a source region of the transistor and can also be coupled (electrically connected) to the back metal. Operations 625 and 630 can be used independently of each other or together.

In the embodiment illustrated in FIG. 6, the TSV is formed in operation 625 after the formation of both metal 1 in operation 610 and metal 2 in operations 620. In this embodiment, the TSV is formed from the back of the wafer because the metal 1 and metal 2 layers interfere with forming the TSV through the top of the wafer. However, in some alternate embodiments, the TSV is formed prior to the formation of both metal 1 in operation 610 and metal 2 in operations 620. In these alternate embodiments, operation 625 is done prior to operations 610 and in some cases prior to operation 605. Further, in these alternate embodiments, the TSV are formed from the top of the wafer. Since the metal 1 and metal 2 layers are not yet formed in these alternate embodiments, the processes used to form the TSV, which can include etching and deposition, can be carried out through the top of the substrate because the metal 1 and metal 2 layers are not present and therefore are not altered by the TSV formation processes. Still in other alternate embodiments the TSV can be formed at different stages of the method.

In operation 635, contacts 236 (both source contacts and drain contacts) are formed on the same side of the vertical transistor. The source contact is coupled (electrically connected) to the second metal source layer and the drain contact is coupled (electrically connected) to the second metal drain layer. This method forms a WLCSP having a conduction path with reduced $R_{DS}(on)$. The $R_{DS}(on)$ is determined by the conduction path which extends vertically from the drain contact through the TSV to the substrate, laterally through the substrate, vertically from the substrate through the PSV to the drift region, and vertically from the PSV to the source contact. In one embodiment, the source contact and the drain contact are formed to have an $R_{DS}(on)$ that is less than 8 mΩ-mm² when the device is turned ON. Next in operation 640 the devices are diced up into smaller devices in a process known as singulation. The method ends in operation 690 when the WLCSP is finalized and prepared for mounting onto a circuit board. Operation 690 can include testing and marking as well as other final operations. Once finished, the WLCSP can be directly mounted onto a circuit board by flipping their solder ball features onto the circuit board and soldering.

Figure 7:
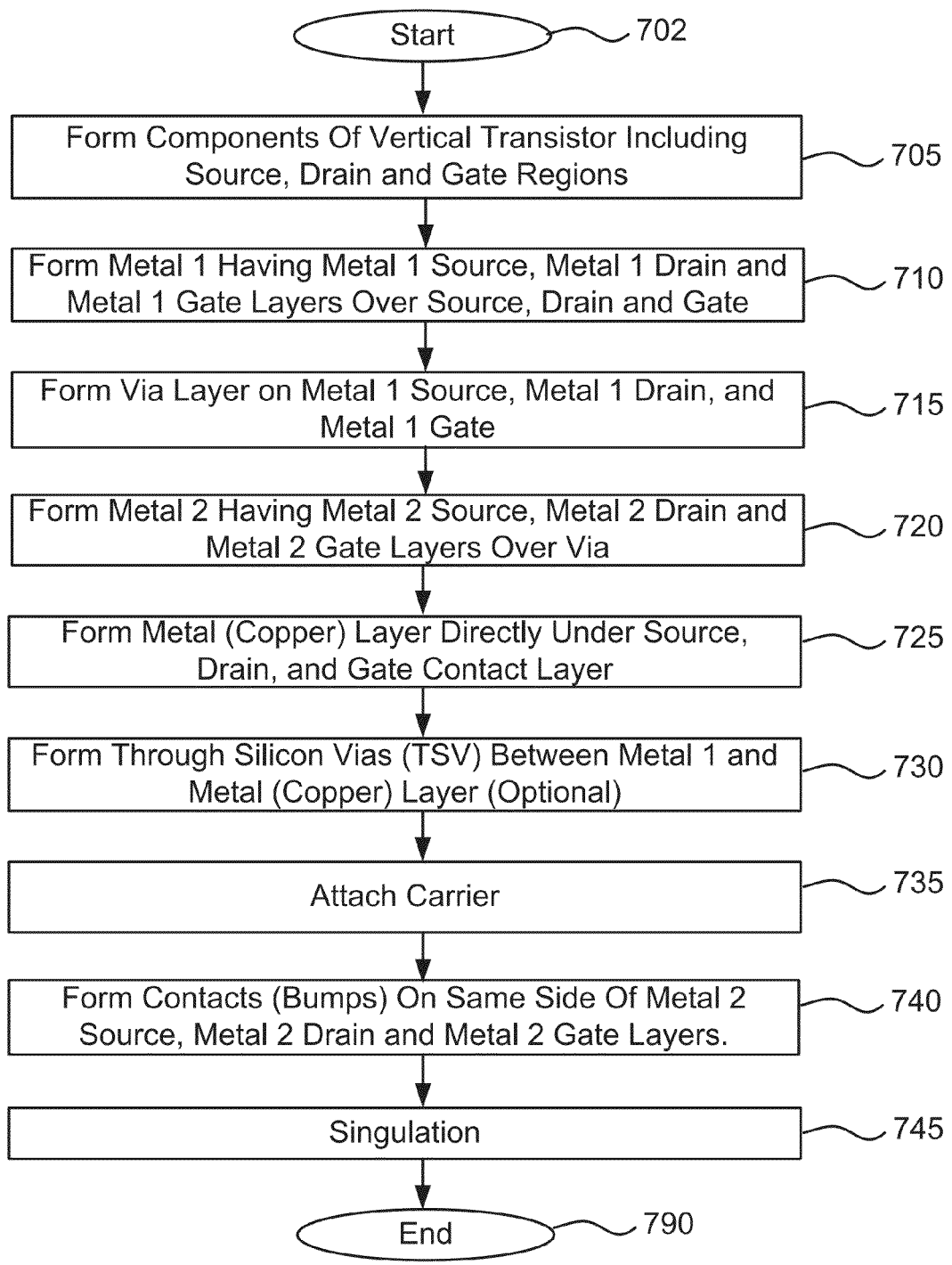
FIG. 7 is a flowchart illustrating a method of fabricating the WLCSP represented in FIGS. 4A-4B for a vertical transistor device with source and drain contacts on the same side and reduced $R_{DS}$(ON), according to another embodiment.

FIG. 7 is a flowchart illustrating a method of fabricating the WLCSP, using metal, such as copper, that is closely connected to the drain drift region as represented in FIGS. 4A-4B, for a vertical transistor (e.g., MOSFET) device with source and drain contacts on the same side and reduced $R_{DS}$ (ON), according to another embodiment. The method starts in operation 702 when a substrate, which can have a lightly doped N epitaxial layer, is provided. In operation 705, components of the vertical transistor, such as the source regions, drain regions, gate regions, and drift regions, are formed on the substrate. These components of the transistor, which are described with reference to FIG. 1, can be formed using known fabrication techniques. Next in operation 710, a first metal layer 430 is formed over the components of the vertical transistor. The first metal layer 430 includes a first metal source layer coupled (electrically connected) to a source region of the vertical transistor and a first metal drain layer coupled (electrically connected) to a drain region of the vertical transistor. The first metal source layer and the first metal drain layer are electrically insulated from each other. The first metal layer 430 can also include a first metal gate layer, which is coupled (electrically connected) to the gate but electrically insulated from both the first metal source layer and the first metal drain layer.

Next in operation 715, a via layer 432 is formed over the first metal layer (metal 1) 430. The via layer 432, which is formed over the first metal source layer, first metal drain layer and first metal gate layer, forms a via pattern to make the proper connections to subsequent layers. The via layer 432 can be formed by depositing an insulating layer, masking the insulating layer and then etching away portions to form the vias. Next in operation 720, a second metal layer 434 (metal 2) is formed over the via layer 432. The second metal layer 434 includes a second metal source layer coupled (electrically connected) to the first metal source layer and a second metal drain layer coupled (electrically connected) to the first metal drain layer. The second metal source layer and the second metal drain layer are electrically insulated from each other. The second metal layer 434 can also include a second metal gate layer, which is coupled (electrically connected) to the gate but electrically insulated from both the second metal source layer and the second metal drain layer. The first metal source layer, the first metal drain layer, the second metal source layer, and the second metal drain layer formed in operations 710 and 715 are interleaved.

In operation 725, a metal layer 452, such as copper or aluminum, is formed under the source of the transistor and the drain of the transistor. In one embodiment, the metal layer 452, which can be a copper layer, is deposited on the structure, which includes transistor (e.g. MOSFET) metal 1, metal 2 and vias, while that structure is upside down. In an alternative embodiment, optional operation 730 is performed. In operation 730, TSV 440 is formed between metal 1 (430) and embedded third metal layer 452. The TSA 440 connects metal 1 (430) to the embedded third metal 452. The TSV 440 can be formed either before or after the formation of third metal layer 452. The TSV 440 can also be formed either before or after the formation of metal 1 (430) and/or metal 2 (434).

In operation 735, a carrier 414 is attached to the metal layer 452 to provide support to the structure. The carrier 414 can be bonded or attached to the metal layer 452 by a conductive adhesive, or other chemical or mechanical attachment methods. The carrier 414, which can be ceramic, silicon, glass, or metal, etc., can have a thickness ranging from 10-200 μm, and mechanically supports the layers and structures formed on top. Next in operation 740, a source contact and a drain contact are formed on the same side of the vertical transistor. The source contact is coupled (electrically connected) to the second metal source layer and the drain contact is coupled (electrically connected) to the second metal drain layer. This method forms a WLCSP having a conduction path with reduced $R_{DS}$(on). The $R_{DS}$(on) is determined by the conduction path which extends vertically from the drain contact to the third metal, laterally through the third metal, and vertically from the third metal through the drift region to the source contact. In one embodiment, the source contact and the drain contact are formed to have an $R_{DS}$(on) that is less than 7 m$\Omega$-mm$^2$ when the device is turned ON. Next in operation 745 the devices are diced up into smaller devices in a process known as singulation. The method ends in operation 790 when the WLCSP is finalized and prepared for mounting onto a circuit board. Operation 790 can include testing and marking as well as other final operations. Once finished, the WLCSP can be directly mounted onto a circuit board by flipping their solder ball features onto the circuit board and soldering.

Although specific embodiments of the invention have been described, various modifications, alterations, alternative constructions, and equivalents are also encompassed within the scope of the invention. The described invention is not restricted to operation within certain specific embodiments, but is free to operate within other embodiments configurations as it should be apparent to those skilled in the art that the scope of the present invention is not limited to the described series of transactions and steps.

It is understood that all material types provided herein are for illustrative purposes only. Accordingly, one or more of the various dielectric layers in the embodiments described herein may comprise any suitable dielectric materials. As well, while specific dopants are names for the n-type and p-type dopants, any other known n-type and p-type dopants (or combination of such dopants) can be used in the semiconductor devices. As well, although the devices of the invention are described with reference to a particular type of conductivity (P or N), the devices can be configured with a combination of the same type of dopant or can be configured with the opposite type of conductivity (N or P, respectively) by appropriate modifications.

The specification and drawings are, accordingly, to be regarded in an illustrative rather than a restrictive sense. It will, however, be evident that additions, subtractions, deletions, and other modifications and changes may be made thereunto without departing from the broader spirit and scope of the invention as set forth in the claim.

What is claimed is:

1. A system comprising:
   a vertical transistor including:
     a trench,
     a gate structure disposed in the trench,
     a source region adjacent to the trench,
     a well region disposed adjacent the trench and adjacent the source region, and
     a drift region disposed between the well region and a substrate;
   a source contact and a drain contact each disposed on a first side of the vertical transistor;
   a through-silicon-via (TSV) coupling a drain region associated with the vertical transistor to a back metal disposed on a second side of the substrate opposite the first side;
   a first metal layer; and
   a second metal layer aligned orthogonal to the first metal layer,
   the system defining a conduction path extending substantially vertically through the TSV to the substrate and laterally through the substrate.

2. The system of claim 1, wherein the conduction path extends substantially vertically from the drain contact through the TSV to the substrate and laterally through the substrate.

3. The system of claim 1, further comprising:
   a partial-substrate-via (PSV) disposed under the source region of the vertical transistor and coupled to the back metal.

4. The system of claim 1, further comprising:
   a PSV extending partially through the substrate,
   the conduction path extending substantially vertically from the drain contact through the TSV to the substrate, laterally through the substrate, vertically from the substrate through the PSV to the drift region, and vertically from the PSV to the source contact.

5. The system of claim 1, further comprising:
   a PSV extending partially through the substrate,
   the conduction path extending substantially vertically from the drain contact through the TSV to the substrate, laterally through the substrate, vertically from the substrate through the PSV to the drift region, and vertically from the drift region to the source contact.

6. The system of claim 1, further comprising:
   a partial-substrate-via (PSV) extending partially through the substrate without penetrating the drift region.

7. The system of claim 1, wherein:
   the first metal layer includes:
     a first metal source layer coupled to the source region of the vertical transistor, and
     a first metal drain layer coupled to the drain region of the vertical transistor, the first metal source layer is electrically insulated from the first metal drain layer; and
   the second metal layer includes:
     a second metal source layer coupled to the source contact and coupled to the first metal source layer, the second metal source layer is aligned orthogonal to the first metal source layer, and
     a second metal drain layer coupled to the drain contact and the first metal drain layer, the second metal drain layer is aligned orthogonal to the first metal drain layer, the second metal source layer is electrically insulated from the second metal drain layer.

8. The system of claim 1, wherein the vertical transistor is a vertical MOSFET.

9. The system of claim 1, wherein:
   the first metal layer includes a first metal gate layer coupled to a gate region of the vertical transistor; and
   the second metal layer includes a second metal gate layer coupled to a gate contact and the first metal gate layer.

10. The system of claim 1, wherein the conduction path has a drain-to-source resistance $R_{DS}$(on) between the source contact and the drain contact that is less than 8 m$\Omega$-mm$^2$ when the system is turned ON.

11. A system, comprising:
    a vertical transistor including:
      a trench,
      a gate structure disposed in the trench,
      a source region adjacent to the trench,
      a well region disposed adjacent to the trench and adjacent to the source region,
      a drift region disposed between the well region and a substrate, a source contact and a drain contact disposed on a first side of the vertical transistor, a through-silicon-via (TSV) coupled to a back metal disposed on a second side of the vertical transistor opposite the first side of the vertical transistor;

a first metal layer coupled to the source region of the vertical transistor; and a second metal layer electrically coupled to the source contact and electrically coupled to the first metal layer, the system defining a conduction path extending substantially vertically through the TSV to the substrate.

12. The system of claim 11, further comprising:

a via layer including a via disposed between the first metal layer and the second metal layer, the first metal layer being coupled to the first metal layer through the via, the second metal layer is aligned orthogonal to the first metal layer at the via.

13. The system of claim 11, further comprising a partial-substrate-via (PSV) extending partially through the substrate.

14. An apparatus, comprising:

a vertical transistor formed in a substrate and including a gate structure, a source region, a well region, and a drift region;

a through-silicon-via (TSV) coupling a drain region associated with the vertical transistor to a back metal of the vertical transistor, the back metal of the vertical transistor being disposed on a first side of the vertical transistor;

a first metal layer;

a second metal layer interleaved with the first metal layer; and a source contact and a drain contact on a second side of the vertical transistor opposite the first side of the vertical transistor, the TSV defining at least a portion of a conduction path extending substantially vertically through the TSV to the substrate and laterally through the substrate.

15. The apparatus of claim 14, wherein the conduction path extends substantially vertically from the drain contact through the TSV to the substrate and laterally through the substrate.

16. The apparatus of claim 14, further comprising:

a partial-substrate-via (PSV) disposed under the source region of the vertical transistor and coupled to the back metal.

17. The apparatus of claim 14, further comprising:

a PSV extending partially through the substrate, the conduction path extending substantially vertically from the drain contact through the TSV to the substrate, laterally through the substrate, vertically from the substrate through the PSV to the drift region, and vertically from the PSV to the source contact.

18. The apparatus of claim 14, wherein the second metal layer includes a second metal source layer and a second metal drain layer, the source contact is coupled to the second metal source layer and the drain contact is coupled to the second metal drain layer.

19. The apparatus of claim 14, wherein the conduction path has a length between the first metal layer and the second metal layer less than 250 μm.

20. The apparatus of claim 14, wherein:

the drift region is formed adjacent to and under the well region, the drift region is formed directly on the substrate;

the second metal layer is aligned orthogonal to the first metal layer;

the first metal layer includes a first metal source layer coupled to the source region of the vertical transistor and includes a first metal drain layer coupled to the drain region of the vertical transistor, the first metal source layer being electrically insulated from the first metal drain layer; and the second metal layer includes a second metal source layer coupled to the first metal source layer and includes a second metal drain layer coupled to the first metal drain layer, the second metal source layer being electrically insulated from the second metal drain layer.

21. The apparatus of claim 14, further comprising:

a via layer over the first metal layer.

\* \* \* \* \*